(12) United States Patent
Lin

(10) Patent No.: US 9,570,661 B2
(45) Date of Patent: Feb. 14, 2017

(54) PROTECTIVE COATING FOR LED LAMP

(71) Applicant: CREE, INC., Durham, NC (US)

(72) Inventor: Shaow B. Lin, Morrisville, NC (US)

(73) Assignee: Cree, Inc., Durham, NC (US)

( * ) Notice: Subject to any disclaimer, the term of this patent is extended or adjusted under 35 U.S.C. 154(b) by 292 days.

(21) Appl. No.: 13/738,575

(22) Filed: Jan. 10, 2013

(65) Prior Publication Data

US 2014/0191648 A1   Jul. 10, 2014

(51) Int. Cl.
| | |
|---|---|
| F41G 1/34 | (2006.01) |
| H01L 33/52 | (2010.01) |
| F21V 3/04 | (2006.01) |
| F21V 3/00 | (2015.01) |
| F21Y 101/00 | (2016.01) |

(52) U.S. Cl.
CPC .............. H01L 33/52 (2013.01); F21K 9/232 (2016.08); F21K 9/233 (2016.08); F21V 3/0472 (2013.01); F21K 9/64 (2016.08); F21V 3/00 (2013.01); F21V 3/0481 (2013.01); F21Y 2101/00 (2013.01); F21Y 2107/30 (2016.08); F21Y 2115/10 (2016.08)

(58) Field of Classification Search
CPC ........ F21V 25/02; F21V 31/00; F21V 31/005; F21V 15/00; F21V 15/012; F21V 15/01
See application file for complete search history.

(56) References Cited

U.S. PATENT DOCUMENTS

| | | | |
|---|---|---|---|
| 2,712,533 A | 7/1955 | Mitchell | |
| 3,581,162 A | 5/1971 | Wheatley | |
| 3,621,323 A * | 11/1971 | Thomas et al. | ............... 313/317 |
| 4,603,168 A | 7/1986 | Sasaki et al. | |
| 5,036,244 A | 7/1991 | Shaffer | |
| 5,124,618 A | 6/1992 | Ohtaka et al. | |
| 5,463,280 A | 10/1995 | Johnson | |
| 5,561,346 A | 10/1996 | Byrne | |
| 5,585,783 A | 12/1996 | Hall | |
| 5,655,830 A | 8/1997 | Ruskouski | |
| 5,688,042 A | 11/1997 | Madadi et al. | |
| 5,723,937 A | 3/1998 | Whitman et al. | |

(Continued)

FOREIGN PATENT DOCUMENTS

| | | |
|---|---|---|
| DE | 102007045540 A1 | 4/2009 |
| EP | 1058221 A2 | 12/2000 |

(Continued)

OTHER PUBLICATIONS

Butts, M., Cella, J., Wond, C. D., Gillette, G., Kerboua, R., Leman, J., Lewis, L., Rajaraman, S., Rubinsztajn, S., Schattenmann, F., Stein, J., Wengrovius, J. and Wicht, D. 2003. "Silicones", Encyclopedia Of Polymer Science and Technology, vol. 11, pp. 765-841.

(Continued)

Primary Examiner — Andrew Coughlin
(74) Attorney, Agent, or Firm — Christopher J. Knors; Moore & Van Allen PLLC

(57) ABSTRACT

The present disclosure discloses a method for providing protective coatings onto one or more surfaces of a frangible enclosure of an LED lamp and a lamp prepared therefrom. More particularly, the present disclosure relates to LED lamps comprising polymer coatings on at least one or more surfaces of an enclosure of an LED lamps.

9 Claims, 10 Drawing Sheets

(56) References Cited

U.S. PATENT DOCUMENTS

| | | |
|---|---|---|
| 5,806,965 A | 9/1998 | Deese |
| 5,947,588 A | 9/1999 | Huang |
| 5,949,347 A | 9/1999 | Wu |
| 6,220,722 B1 | 4/2001 | Begemann |
| 6,227,679 B1 | 5/2001 | Zhang et al. |
| 6,234,648 B1 | 5/2001 | Borner et al. |
| 6,250,774 B1 | 6/2001 | Begemann et al. |
| 6,276,822 B1 | 8/2001 | Bedrosian et al. |
| 6,465,961 B1 | 10/2002 | Cao |
| 6,501,219 B1 | 12/2002 | Bigio et al. |
| 6,523,978 B1 | 2/2003 | Huang |
| 6,538,364 B1 | 3/2003 | Shaw |
| 6,550,953 B1 | 4/2003 | Ichikawa et al. |
| 6,634,770 B2 | 10/2003 | Cao |
| 6,659,632 B2 | 12/2003 | Chen |
| 6,709,132 B2 | 3/2004 | Ishibashi |
| 6,803,607 B1 | 10/2004 | Chan et al. |
| 6,848,819 B1 | 2/2005 | Arndt et al. |
| 6,864,513 B2 | 3/2005 | Lin et al. |
| 6,940,101 B2 | 9/2005 | Yano |
| 6,948,829 B2 | 9/2005 | Verdes et al. |
| 6,982,518 B2 | 1/2006 | Chou et al. |
| 7,048,412 B2 | 5/2006 | Martin et al. |
| 7,080,924 B2 | 7/2006 | Tseng et al. |
| 7,086,756 B2 | 8/2006 | Maxik |
| 7,086,767 B2 | 8/2006 | Sidwell et al. |
| 7,144,135 B2 | 12/2006 | Martin et al. |
| 7,165,866 B2 | 1/2007 | Li |
| 7,172,314 B2 | 2/2007 | Currie et al. |
| 7,354,174 B1 | 4/2008 | Yan |
| 7,396,142 B2 | 7/2008 | Laizure, Jr. et al. |
| 7,600,882 B1 | 10/2009 | Morejon et al. |
| 7,726,836 B2 | 6/2010 | Chen |
| 7,824,065 B2 | 11/2010 | Maxik |
| 7,965,023 B1 | 6/2011 | Liang |
| 8,021,025 B2 | 9/2011 | Lee |
| 8,253,316 B2 | 8/2012 | Sun et al. |
| 8,272,762 B2 | 9/2012 | Maxik et al. |
| 8,274,241 B2 | 9/2012 | Guest et al. |
| 8,277,082 B2 | 10/2012 | Dassanayake et al. |
| 8,282,249 B2 | 10/2012 | Liang et al. |
| 8,282,250 B1 | 10/2012 | Dassanayake et al. |
| 8,292,468 B2 | 10/2012 | Narendran et al. |
| 8,322,896 B2 | 12/2012 | Falicoff et al. |
| 8,371,722 B2 | 2/2013 | Carroll |
| 8,400,051 B2 | 3/2013 | Hakata et al. |
| 8,415,865 B2 | 4/2013 | Liang et al. |
| 8,421,320 B2 | 4/2013 | Chuang |
| 8,421,321 B2 | 4/2013 | Chuang |
| 8,421,322 B2 | 4/2013 | Carroll et al. |
| 8,427,037 B2 | 4/2013 | Liang et al. |
| 8,434,883 B2 | 5/2013 | Doan et al. |
| 8,449,154 B2 | 5/2013 | Uemoto et al. |
| 8,502,468 B2 | 8/2013 | Li et al. |
| 8,556,465 B2 | 10/2013 | Lee et al. |
| 8,641,237 B2 | 2/2014 | Chuang |
| 8,653,723 B2 | 2/2014 | Cao et al. |
| 8,696,168 B2 | 4/2014 | Li et al. |
| 8,740,415 B2 | 6/2014 | Wheelock |
| 8,750,671 B1 | 6/2014 | Kelly et al. |
| 8,752,984 B2 | 6/2014 | Lenk et al. |
| 8,760,042 B2 | 6/2014 | Sakai et al. |
| 2004/0201990 A1 | 10/2004 | Meyer |
| 2006/0152140 A1 | 7/2006 | Brandes |
| 2009/0184618 A1 | 7/2009 | Hakata et al. |
| 2010/0201284 A1 | 8/2010 | Kraus |
| 2010/0314996 A1* | 12/2010 | van de Ven et al. ......... 313/512 |
| 2011/0044026 A1 | 2/2011 | Deeben et al. |
| 2011/0216523 A1 | 9/2011 | Tong et al. |
| 2012/0040585 A1 | 2/2012 | Huang |
| 2012/0056542 A1* | 3/2012 | Hu .................... F21K 9/135 315/113 |
| 2012/0224352 A1 | 9/2012 | Yagi et al. |
| 2012/0224363 A1 | 9/2012 | Van De Ven |
| 2012/0236573 A1* | 9/2012 | Yamamoto .............. F21V 25/02 362/311.02 |
| 2012/0250304 A1 | 10/2012 | Harbers et al. |
| 2012/0250320 A1 | 10/2012 | Harbers et al. |
| 2013/0107517 A1* | 5/2013 | Shih .................... F21V 3/00 362/235 |
| 2013/0170175 A1* | 7/2013 | Negley ................ F21V 29/004 362/84 |
| 2013/0187537 A1 | 7/2013 | Hikmet et al. |
| 2013/0271972 A1 | 10/2013 | Hussell et al. |
| 2013/0271981 A1 | 10/2013 | Hussell et al. |
| 2013/0271987 A1 | 10/2013 | Hussell et al. |
| 2014/0016312 A1* | 1/2014 | Moon .................... F21K 9/135 362/235 |
| 2014/0168977 A1* | 6/2014 | Hu ..................... F21V 29/20 362/249.02 |
| 2014/0268819 A1 | 9/2014 | Negley et al. |

FOREIGN PATENT DOCUMENTS

| | | |
|---|---|---|
| EP | 0890059 B1 | 6/2004 |
| EP | 2270100 A1 | 1/2011 |
| GB | 2345954 A | 7/2000 |
| JP | H09265807 A | 10/1997 |
| JP | 2000173304 A | 6/2000 |
| JP | 2001118403 A | 4/2001 |
| JP | 2007277456 A | 10/2007 |
| JP | 2011119187 A * | 6/2011 |
| WO | 0124583 A1 | 4/2001 |
| WO | 0160119 A2 | 8/2001 |
| WO | 2009136351 A1 | 11/2009 |
| WO | 2012011279 A1 | 1/2012 |
| WO | 2012031533 A1 | 3/2012 |
| WO | 2012042434 A1 | 4/2012 |

OTHER PUBLICATIONS

Waddell, W. H. 2006, "Silica, Amorphous," Kirk-Othmer Encyclopedia of Chemical Technology, vol. 22, pp. 1-33.

U.S Patent and Trademark Office, U.S. Appl. No. 13/951,206, Non-Final Office Action dated Dec. 3, 2014, 17 pages.

Cree, Inc., International Application No. PCT/US2014/010792, International Search Report and Written Opinion, Mar. 20, 2014.

Cree, Inc., International Application No. PCT/US2014/010868, International Search Report and Written Opinion, Apr. 3, 2014.

United States Patent & Trademark Office, U.S. Appl. No. 13/951,206, Non-Final Office Action dated Dec. 3, 2014, 16 pages.

Cree, Inc., International Preliminary Report of Patentability for International Application No. PCT/US2014/010792 dated Jul. 23, 2015, 7 pages.

Cree, Inc., International Preliminary Report of Patentability for International Application No. PCT/US2014/010868 dated Jul. 23, 2015, 7 pages.

Cree, Inc., International Application No. PCT/US2014/024472, International Preliminary Report on Patentability, Sep. 24, 2015, 10 pages.

Cree, Inc., International Application No. PCT/US2014/024472, International Search Report and Written Opinion, Jul. 3, 2014, 14 pages.

Opti-Tec, "Optically Clear Polyurethane Encapsulant Polling Compund," Dec. 12, 2009, downloaded from <https://web.archive.org/web/2009121201/http://www.intertronics.co.uk/products/opt4200.htm> on Jun. 18, 2014, 3 pages.

Lamonica, Martin, "Cree Introduces an LED Bulb Edison Would Love," Mar. 5, 2013, MIT Review, downloaded from <http://www.technologyreview.com/view/512126/cree-introduces-an-led-bulb-edison-would-love/> on Jun. 18, 2014, 2 pages.

U.S. Appl. No. 13/838,198, Non-Final Office Action, Jan. 15, 2015, 14 pages.

U.S. Appl. No. 13/838,198, Final Office Action, Jul. 31, 2015, 15 pages.

(56) References Cited

OTHER PUBLICATIONS

U.S. Appl. No. 13/838,198, Non-Final Office Action, Jan. 25, 2016, 15 pages.
U.S. Appl. No. 13/838,198, Final Office Action, Sep. 2, 2016.

* cited by examiner

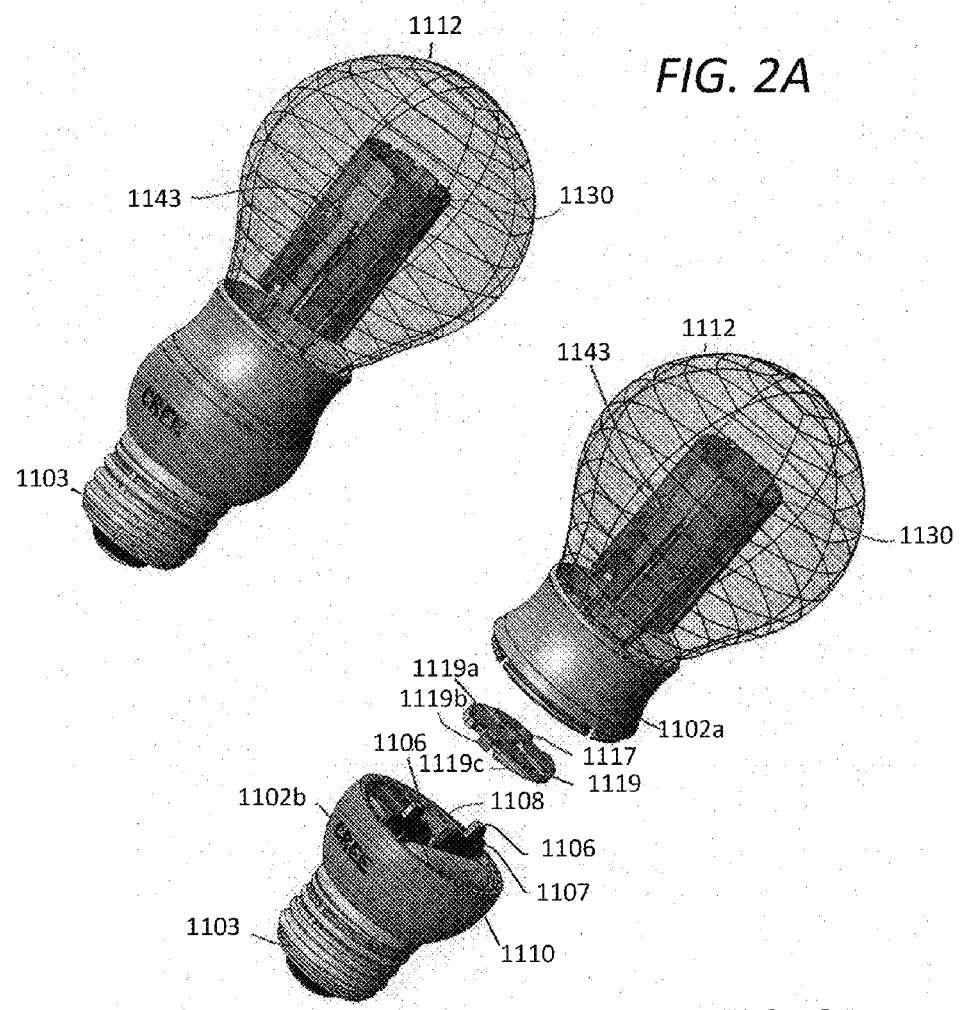

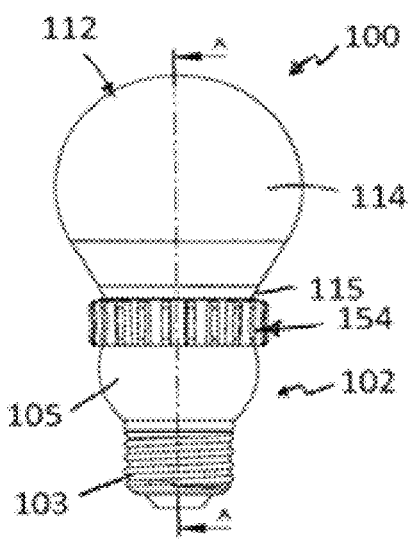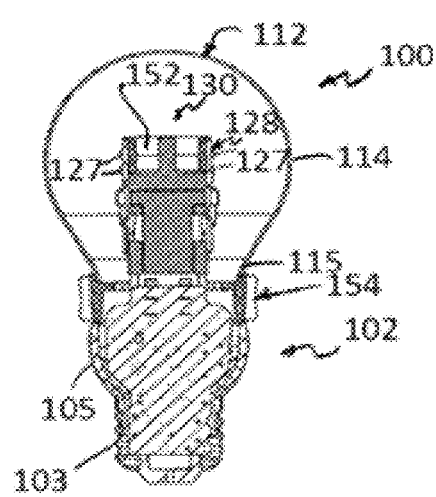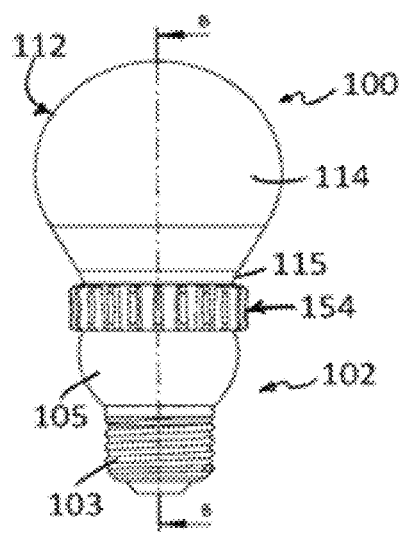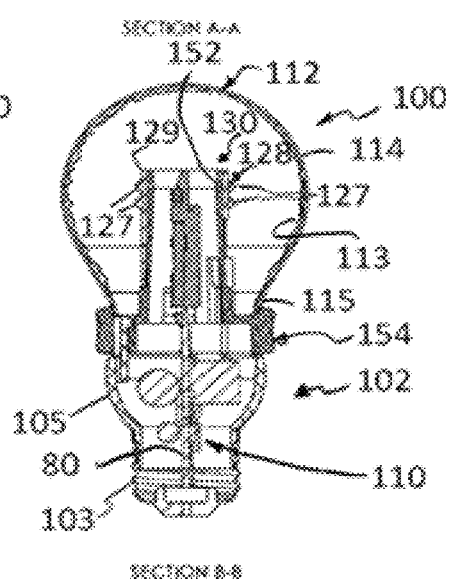
FIG. 4A  FIG. 5A
FIG. 4B  FIG. 5B

PROTECTIVE COATING FOR LED LAMP

TECHNICAL FIELD

The present disclosure relates to light emitting diode (LED) lamps and methods of applying coatings onto the surface of a frangible enclosure of an LED lamp. More particularly, the present disclosure relates to LED lamps comprising optically clear transparent coatings and LED lamps made thereby.

BACKGROUND

Light emitting diode (LED) lighting systems are becoming more prevalent as replacements for older lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury.

Incandescent bulbs (and fluorescent bulbs) are typically formed with a frangible enclosure (e.g. glass) that maintains a vacuum or environment to prevent oxidation of the glow filament (e.g. tungsten) or maintain function during operation. The incandescent bulb can be coated by dipping it into a silicone dispersion consisting of excess solvent (e.g., xylene) and curable silicone rubber with the subsequent removal of the solvent. Other methods include initially coating the incandescent bulb with an organic solvent-based silicone composition followed by solvent removal and/or treating the coated lamp bulb surface with a solvent-based silicone overcoat. Commercial incandescent light bulbs with a protective coating can be made using a paste-like silicone rubber compound that requires large amount of solvent to dilute the silicone rubber compound down to a high solvent containing solution to allow light bulb coating. Unfortunately, hazardous and flammable solvents such as toluene, xylene are the required solvents. For example, Elastosil LR 3043 requires 1.5× solvent (xylene, toluene, etc.) to make a 40% solid solution for dip coating. This was mentioned in a link that references commercial "safety-coated" bulbs: http://www.bulbs.com/Safety Coated/results aspx?No=20&Ns=P Wattage+Sort%7C1). While various silicone coating compositions are otherwise known for treating the bulbs of incandescent lights to enhance their shatter resistance, issues specific only to LED lamps remain regarding reducing or completely preventing access to the components within a frangible enclosure, the use of phosphors, the use of internal atmospheres or environments within the enclosure, as well as significant environmental concerns with solvent-based coatings.

SUMMARY

In a first embodiment, a method is provided, the method comprising providing an LED lamp with a frangible enclosure comprising a first environment contributing to a first luminous output, wherein egress into or out of the enclosure provides a second environment different from the first environment, the second environment contributing to a second luminous output of the LED lamp, the second luminous output different from the first luminous output; coating at least a portion of the frangible enclosure with a coating, the coating reducing or eliminating egress into or out of the enclosure; and reducing or preventing luminous change upon breach of the frangible enclosure.

In a second embodiment, an LED lamp is provided. The lamp comprising: An LED lamp comprising: a frangible enclosure having an internal surface and an external surface, the frangible enclosure coupled to a threaded metal base and enclosing at least one LED element and a first environment, the first environment being different from a second environment external to the frangible enclosure; and a coating at least partially covering one or both of the internal surface and the external surface of the frangible enclosure.

In a third embodiment, a method of coating an LED lamp is provided. The method comprising: providing an LED lamp, the lamp comprising: a frangible enclosure having an internal surface and an external surface, the frangible enclosure couplable to a threaded metal base and for enclosing at least one LED element and a first environment, the first environment being different from a second environment external to the frangible enclosure; optionally, one or more phosphors; and contacting the frangible enclosure with a coating composition.

BRIEF DESCRIPTION OF THE DRAWINGS

FIG. 2A is a perspective view of the LED lamp of FIG. 1.

FIG. 2B is a partial exploded perspective view of the LED lamp of FIG. 2A.

FIG. 4A is a front view of an embodiment of a LED lamp suitable for coating in accordance with the present disclosure.

FIG. 4B is a side view of the lamp of FIG. 4A.

FIG. 5A is a section view taken along line A-A of FIG. 4A.

FIG. 5B is a section view taken along line B-B of FIG. 4B.

DETAILED DESCRIPTION

Figures 1A, 1B:
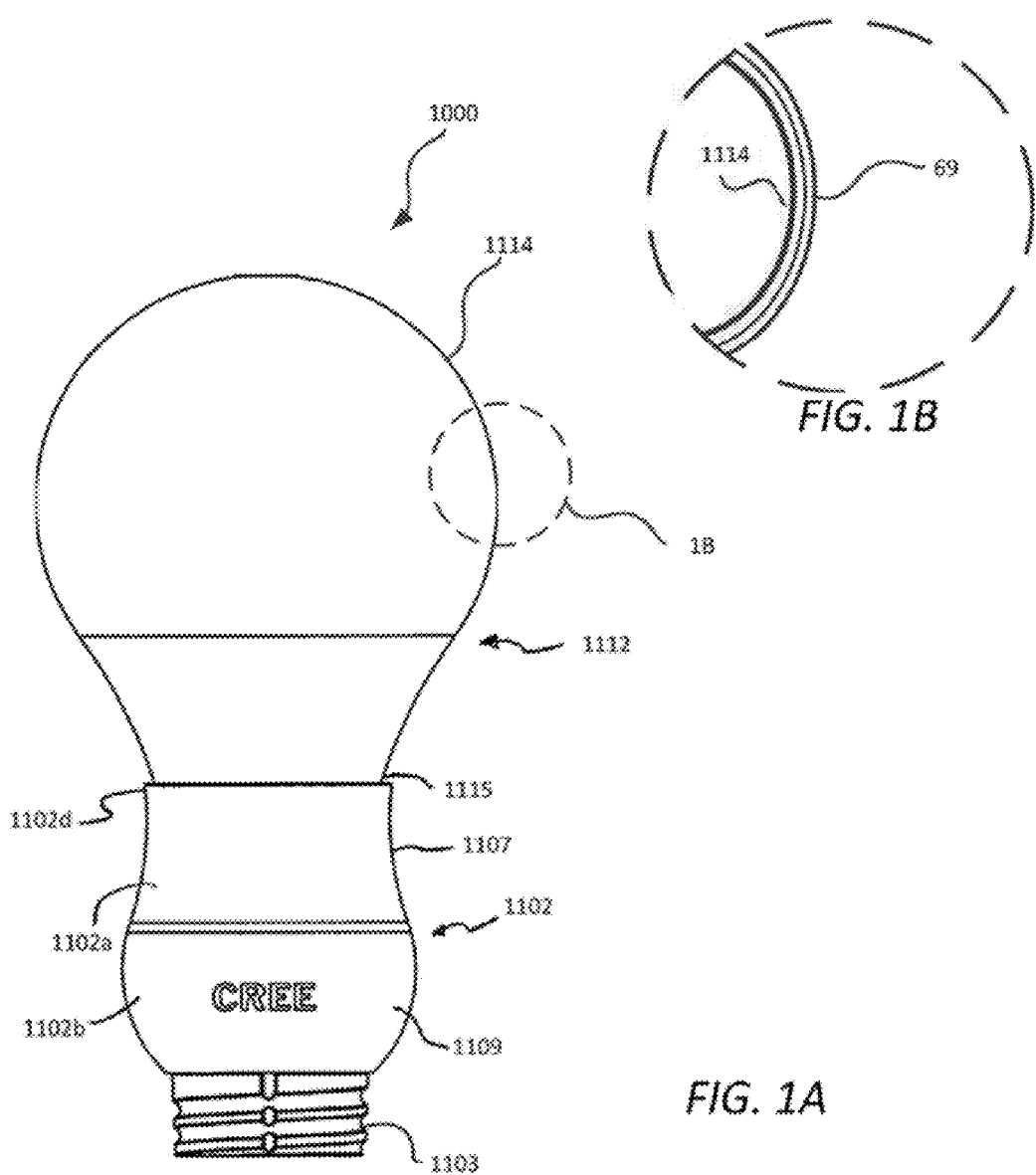
FIG. 1A is a plan view of an embodiment of a LED lamp usable in embodiments of the present disclosure.
FIG. 1B is a partial exploded view of a section of the LED lamp of FIG. 1a in embodiments of the present disclosure.

The present disclosure provides, among other aspects, for an LED lamp with a frangible enclosure comprising a coating on one or both of the internal and external surfaces of the frangible enclosure. The coating is configured to prevent egress in or out of the frangible enclosure upon a breach. The frangible enclosure can contain a first environment contributing to a first luminous output, wherein egress into or out of the enclosure provides a second environment different from the first environment, the second environment contributing to a second luminous output of the LED lamp, the second luminous output different from the first luminous output. Thus, in one aspect the coating, which may include or be part of a plurality of discrete layers of the same or different material, reduces or eliminates egress into or out of the enclosure, which in turn reduces or prevents luminous change upon breach of the frangible enclosure.

The present disclosure also provides, among other aspects, an LED lamp comprising a frangible enclosure having an internal surface and an external surface, the frangible enclosure coupled to a threaded metal base and enclosing at least one LED element and a first environment. In one aspect, the first environment is different from a second environment external to the frangible enclosure. The coating herein disclosed at least partially covers one or both of the internal surface and the external surface of the frangible enclosure. The coating may include a plurality of discrete layers of the same or different material, or may be deposited on one or more existing layers previously deposited on the enclosure or the coating can be at least partially covered by one or more layers ("cover layers"). In one aspect, the one or more deposited layers or cover layers can contain one or more phosphors, diffusers, lanthanide oxides and other optical materials. The coating herein disclosed is configured to control egress of one or more contents of the enclosure, e.g., solids, liquids, or gases from entering or exiting the enclosure in the event of a breach.

The present disclosure also provides, among other aspects, the preparation and process of applying the presently disclosed coating. Thus, precursor components and/or a curable coating for an LED lamp are provided. Accordingly, in one embodiment of the present disclosure is provided a precursor component and/or a curable coating for an LED lamp. In some aspects, one or more of the precursor components and/or curable coating has at least one reactive group suitable for physical or chemical coupling and/or crosslinking. In additional embodiments, an essentially solvent free coating composition is provided with long-term self-life suitable for the manufacturing of large numbers of LED lamps with excellent process latitude. This invention found a solvent-free silicone elastomer compound can be successfully applied as protective coating for glass light bulb. No solvent is required to produce LED light lamp with shatter-proof property. However, the viscosity of such solvent-free silicone elastomer mixtures increases rapidly at room temperature and becomes too viscous to be useable within a short few hours (3-8 hrs), this makes large-scale production process very difficult, in-efficient and costly.

This disclosure further provides means to stabilize the viscosity of solvent-free silicone elastomer mixtures from increasing and extend the working life (pot life) to days. The quality and property of the solvent-free silicone elastomer mixtures are not compromised e.g., have a rapid increase in viscosity over time, using the current methods and compositions. This makes it extremely desirable and efficient to carry out large scale production coating processing of LED lamps.

Embodiments of the present disclosure now will be described more fully hereinafter with reference to the accompanying drawings, in which embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the claims to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated" listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this present disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

The terms "crosslink" and "crosslinking" as used herein refer without limitation to joining (e.g., adjacent chains of a polymer) by creating covalent or ionic bonds. Crosslinking can be accomplished by known techniques, for example, thermal reaction, chemical reaction or ionizing radiation (for example, UV/Vis radiation, electron beam radiation, X-ray, or gamma radiation, catalysis, etc.).

The phrase "precursor component" is used herein interchangeably with "coating matrix" and "matrix," and refers without limitation to one or more materials or one or more compositions of matter that are capable of transitioning from a liquid to a solid or gel suitable for use in or with a light emitting device as a coating of, around, or about one or more components of the lighting device.

A solid-state lighting system may take the form of a lighting unit, light fixture, light bulb, or a "lamp." A solid-state lighting system includes an LED lighting system. An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and or the LEDs in the lamp.

Since, ideally, an LED lamp designed as a replacement for a traditional incandescent or fluorescent light source needs to be self-contained; a power supply is included in the lamp structure along with the LEDs or LED packages and the optical components. A heatsink is also often needed to cool the LEDs and/or power supply in order to maintain appropriate operating temperature. The power supply and especially the heatsink can often hinder some of the light coming from the LEDs or limit LED placement. Depending on the type of traditional bulb for which the solid-state lamp is intended as a replacement, this limitation can cause the solid-state lamp to emit light in a pattern that is substantially different than the light pattern produced by the traditional light bulb that it is intended to replace.

An LED lamp may be constructed with a frangible enclosure or "bulb"-like structure that if comprised, in whole or in part, would alter its function or render it non-functional. For example, the LED lamp may contain an environment within the frangible enclosure different from that of the ambient environment it is used. Breach of the frangible enclosure may result in egress in or out of the enclosure of an environment (e.g., gas) or a substance (e.g., phosphor, diffuser, etc.,) that can compromise one or more features or properties of the LED lamp, such as its lifetime, its color rendering index (CRI), its luminous output or intensity, and its heat dissipation capability. The LED lamp may be accidentally contacted with a force that may only crack the enclosure or it may completely fragment the enclosure. Containment of the environment of the enclosure and/or containment of at least a portion of the fragmented and/or breached enclosure using the coating herein disclosed is a desirable improvement for an Edison incandescent light replacement device. In certain aspects, the LED lamp coated as described herein is not under vacuum or partial pressure relative to its ambient environment, in contrast to an Edison bulb.

Likewise, the ability of the LED lamp to maintain some level of performance after breach of its enclosure is a desirable attribute that cannot be achieved with an Edison bulb due to the rapid burn out of the tungsten filament, for example. This provides the LED lamp with the capability for emergency lighting applications. For example the presently disclosed LED lamp can be used where it is likely its enclosure would be compromised, yet the luminosity of the LED lamp would nonetheless continue for a desirable time thereafter. For example, the environment within the frangible enclosure can be air or other gas mixture and the ambient environment can be liquid, the coating preventing the egress of the liquid and/or the gas for a time after breach of the enclosure to provide emergency lighting. The coating may be configured to allow minutes, hours, days, or weeks of acceptable and/or functional operation under a condition where the frangible enclosure is partially or completely compromised. The coating can be selected based on its diffusion and/or transport properties of certain gases and liquids and/or to complement its optical transmissive properties.

For example, an LED lamp may include an environment comprising one or more gases within the optically transmissive, frangible enclosure so as to provide thermal coupling to the LED array and any power supply components that might be included therein. A combination of gasses can be used. Examples include one or more of inert gases (e.g., helium, neon, argon, krypton, etc.), hydrogen, halocarbons such as chlorofluorocarbons, and hydrochlorofluorocarbon. In one aspect, gas or gases with a thermal conductivity in milliwatts per meter Kelvin (mW/m-K) of from about 45 to about 180 can be used. For purposes of this disclosure, thermal conductivities are given at standard temperature and pressure (STP). It is to be understood that thermal conductivity values of gasses may change at different pressures and temperatures. Gasses can be used with an embodiment of the invention where the gas has a thermal conductivity of at least about 45 mW/m-K, least about 60 mW/m-K, at least about 70 mW/m-K, least about 100 mW/m-K, at least about 150 mW/m-K, from about 60 to about 180 mW/m-K, or from about 70 to about 150 mW/m-K. The coating may be configured to allow minutes, hours, days, or weeks of acceptable and/or functional operation without overheating under a condition where the frangible enclosure is partially or completely compromised, the gas or gases escape or change in composition. The coating can be selected based on its diffusion and/or transport properties of the particular gases used and/or to complement its optical transmissive properties.

Of course, the coating disclosed herein can provide for some level of resistance to breach of the frangible enclosure by virtue of its physical properties and/or coating thickness, such as its elongation and compressibility properties. These attributes, alone or in combination are provided to the LED lamp with the coating herein described.

In other embodiments, the coating described herein can be applied to at least a portion of one or both of the external or internal surfaces of the frangible enclosure to contain at least a portion of particulates or particulate material present within the LED lamp or formed upon breach thereof. In one aspect a tacky coating internally applied to a frangible enclosure can be used to retain such particulate matter upon breach of the enclosure. In one aspect the particulate material is phosphor or lumiphoric material, diffuser, or lanthanide oxide. The coating can be applied over at least a portion of one or more preexisting layers and/or under one or more additional layers containing the particulate materials or other optical materials. The coating can completely cover the one or more preexisting or additional layers.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to coatings, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

Embodiments of the present disclosure provide a solid-state lamp with centralized light emitters, more specifically, LEDs (hereinafter, interchangeably used with "LED lamp" or "LED bulb" Multiple LEDs can be used together, forming an LED array. The LEDs can be mounted on or fixed within the lamp in various ways. It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture for mounting on walls, in or on ceilings, on posts, and/or on vehicles.

Coating Materials

The curable coating and/or precursor components herein disclosed provide, among other things, a resultant light transparent and optionally a low index of refraction polymeric matrix. Suitable curable coating and/or one or more precursor components providing low index of refraction or highly visible light transparent organic polymers include silicones, polyesters, polyurethanes, acrylics (e.g., polyacrylates, polymethacrylates, hereafter "poly(meth)acrylates"), epoxies, fluoropolymers, and combinations thereof.

Preferably, the resultant light transparent polymeric matrix has an index of refraction of less than about 1.6, preferably less than about 1.5. In one aspect, the light transparent polymeric matrix is transparent in the visible spectra and/or at least a portion of the UV region (e.g., from about 200 nanometers to about 850 nanometers). In other aspects, the light transparent polymeric matrix is transparent in the visible spectra and not transparent (e.g., substantially absorbing) in the UV region (e.g., from about 200 nanometers to about 850 nanometers). Preferably, the light transparent polymeric matrix is at least 85% transparent in the visible spectra, at least 90% transparent, or at least 95% transparent corresponding to the wavelength(s) of the LED light emitted from the package.

In certain aspects, the curable coating is a one- or two-part-curable formulation comprising one or more precursor components. The precursor component is any one or more precursors that are suitable for and capable of providing an optically transparent coating for use in a lighting device. In one aspect, the precursor component comprises one precursor. In another aspect, the precursor component is comprised of a "two-part composition". The precursor component provides for a cured or set coating optionally with other components. The cured or set coating prepared from the precursor components includes, sol-gels, gels, glasses, ceramics, cross-linked polymers, and combinations thereof.

Examples of cured or set matrixes formed from the one or more precursor components include, for example, one or more polymers and/or oligomers of silicones, e.g., polysiloxanes (e.g., polydialklysiloxanes (e.g., polydimethylsiloxane "PDMS"), polyalkylaryl siloxanes and/or polydiarylsiloxanes), epoxy resins, polyesters, polyarylesters, polyurethanes, cyclic olefinic copolymers (COC's), polynorbornenes, or hybrids and/or copolymers thereof, or such materials in combination with other components. Examples of LED coatings include, without limitation, LIGHT CAP® LED Casting Resin 9622 acrylated polyurethane, (Dynamax Corp., Torringtion Conn.); LPS-1503, LPS-2511, LPS-3541, LPS-5355, KER-6110, KER-6000, KER-6200, SCR-1016, ASP-1120, ASP-1042, KER-7030, KER-7080 (Shin-Etsu Chemical Co., Ltd, Japan); QSil 216, QSil 218, QSil 222, and QLE 1102 Optically Clear, 2-part Silicone coating (ACC Silicones, The Amber Chemical Company, Ltd.), United Kingdom); LS3-3354 and LS-3351 silicone coatings from NuSil Technology, LLC (Carpinteria, Calif.); TSE-3032, RTV615, (Momentive Potting Silicone, Waterford, N.Y.); Epic S7253 Polyurethane coating (Epic Resins, Palmyra, Wis.); OE-6630, OE-6631, OE-6636, OE-6336, OE-6450, OE-6652, OE-6540, OE-7630, OE-7640, OE-7620, OE-7660, OE-6370M, OE-6351, OE-6570, JCR-6110, JCR-6175, EG-6301, SLYGUARD silicone elastomers (Dow Corning, Midland, Mich.).

Preferably, the one- or two part-curable precursor component(s) are of low solvent content. More preferably, the one- or two part-curable precursor component(s) are essentially solvent-free. Essentially solvent-free is inclusive of no solvent and trace amounts of low volatility components, where trace amounts is solvent is present, but at an amount less than 5 weight percent, less than 1 weight percent, and less than 0.5 weight percent.

In one aspect, the coating comprises one or more silicon precursor components, which can comprise siloxane and/or polysiloxane. A number of polysiloxanes, with varying backbone structure are suitable for use as a precursor component. With reference to Equation (1), various forms of polysiloxanes, e.g. the M, T, Q, and D backbones, where R is, independently, alkyl or aryl, are presented:

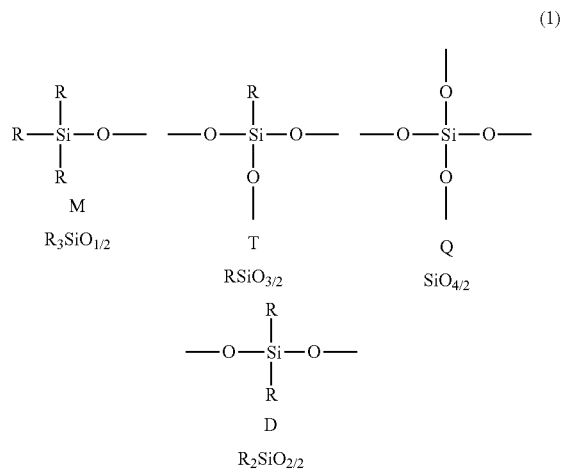

In various aspects, precursor components comprise one or more reactive silicone containing polymers (and/or oligomers or formulations comprising same). Such one or more reactive functional groups can be mixed with non-reactive silicone containing polymers. Examples of reactive silicone containing polymers with reactive groups, include for example, linear or branched polysiloxanes containing at least one acrylate, methacrylate, acrylamide, methacrylamide, fumarate, maleate, norbornenyl and styrene functional groups, and/or linear or branched polysiloxanes with multiple reactive groups such as Si—H (silicon hydride), hydroxy, alkoxy, amine, chlorine, epoxide, isocyanate, isothiocyanate, nitrile, vinyl, and thiol functional groups. Some specific examples of such linear or branched polysiloxanes include hydride-terminated, vinyl-terminated or methacrylate-terminated polydimethyl siloxanes, polydimethyl-co-diphenyl siloxanes and polydimethyl-co-methylphenylsiloxanes. The reactive groups can be located at one or both terminuses of the reactive silicone polymers, and/or anywhere along the backbone and/or branches of the polymer.

In one aspect, an exemplary example of a silicone precursor component comprises linear siloxane polymers, with dimethyl or a combination of methyl and phenyl chemical groups, with one or more reactive "R" chemical groups; where R is independently, hydrogen, vinyl or hydroxyl.

In another aspect, an exemplary example of a silicone precursor component comprises branched siloxane polymers, with dimethyl or a combination of methyl and phenyl chemical groups with one or more reactive "R" chemical groups, where R is independently hydrogen, vinyl or hydroxyl) associated with the precursor component.

In another aspect, an exemplary example of a silicone precursor component comprises linear siloxane polymers, with a combination of methyl, phenyl and hydroxyl or alkoxy chemical groups, with one or more reactive "R" chemical groups where R is hydrogen, vinyl or hydroxyl associated with the precursor component.

In another aspect, an exemplary example of a silicone precursor component comprises branched siloxanes, with any of methyl, phenyl and hydroxyl or alkoxy chemical groups, with one or more reactive "R" chemical groups where R is hydrogen, vinyl or hydroxyl associated with the precursor component.

Additional substances in the aforementioned coating or one or more precursor components providing the coating can be used, e.g., platinum catalyst, casting aids, defoamers, surface tension modifiers, functionalizing agents, adhesion promoters, crosslinking agents, viscosity stabilizers, other polymeric substances, and substances capable of modifying the tensile, elongation, optical, thermal, rheological, and/or morphological attributes of the precursor component or resulting coating.

In one aspect, a curable precursor component alone or with other material can be used specifically for forming coating for a LED lamp, for example, a LED lamp with a glass enclosure surrounding the LEDs and/or electrical components.

In one aspect, one or more of the precursor components can comprise a silsesquioxane and/or polyhedral oligomeric silsesquioxane moiety (hereafter, collectively referred to as "POSS moieties"). POSS moieties suitable for the coating of the present disclosure are represented generally by Formula (1) below:

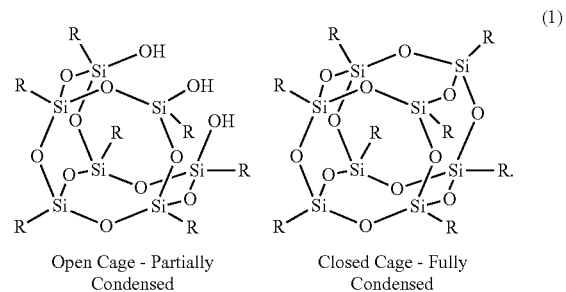

Open Cage - Partially Condensed    Closed Cage - Fully Condensed showing a representative example of an open cage, partially condensed and closed cage, fully condensed POSS moiety, wherein the R groups may be the same or different, optionally with at least one of the R groups being a group having chemical functionality, further described below. In one aspect, at least one of the R groups is associated with and/or provides an precursor component. In other aspects, at least one of the R groups is a reactive group suitable for physical or chemical association or reaction, to provide, or be in combined with, one or more precursor components. The R group may be the same or different, selected from hydrogen, hydroxy, alkoxy, amine, chlorine, epoxide, isocyanate, methacrylate, acrylate, methacrylamide, acrylamide, nitrile, isocyanate, isothiocyanate, norbornenyl, alkenyl, vinyl, styrenyl, or thiol. In the above aspects, at least one of the R groups can optionally be a non-reactive group, which may be the same or different, independently selected from substituted, branched, un-branched, cyclic, or acyclic $C_{1-30}$ alkyl, and aryl and/or substituted, branched, or un-branched $C_{6-30}$ substituted aryl groups.

"POSS moiety", as used herein is inclusive of polyhedral oligomeric silsesquioxanes, and compounds, organic polymers/oligomers, inorganic polymers/oligomers, and/or organic-inorganic polymers containing one or more open and/or closed cage silsesquioxane moieties, with any of the R groups and/or chemical functional groups, described above.

In one example polydimethylsiloxane (PDMS) with hydroxyl (—OH) end-capped groups represents a difunctional, D-type precursor component, that has undergone condensation reactions, forming a linear chain of dimethylsiloxane groups. End-capped hydroxyl groups with either POSS moieties provides for further condensation with any hydrolyzed precursors in which to yield longer linear chains and/or branched structures (incorporating T and Q precursor types) and other chemical functionalities (e.g. methyl, Si—H, vinyl, hydroxyl, etc.). If either the Si—H or Si-vinyl chemical groups are present in or at the terminus of PDMS chains, the polymer or oligomer can be attached to other molecules through hydrosilylation with the respective (Si-vinyl, Si—H) chemical groups, using a platinum catalyst, for example.

Other precursor component structures can be fabricated by including T- and/or Q-type precursors with functional groups with a PDMS structure as described above. These precursor types allow for branching of the linear PDMS chain and possess a more inorganic content relative to the M- and D-types. T- and Q-type precursor may be used provided excess levels are not used such that the structures with high inorganic content and a highly rigid character result, which may have an adverse effect on mechanical properties (e.g. brittleness, porosity, etc.) and processing (e.g. lower moldability) of the final coating. Thus, in one aspect, a PDMS oligomer precursor with one or more chemical groups are used. For example, a PDMS oligomer having one or more phenyl side groups and Si—H and/or vinyl end-terminated groups is used.

In one aspect, one or more polymers and/or oligomers of polysiloxanes are used. The one or more polymers and/or oligomers of polydialklysiloxanes (e.g., polydimethylsiloxane PDMS), polyalkylaryl siloxanes and/or polydiarylsiloxanes can comprise one or more functional groups selected from acrylate, methacrylate, acrylamide, methacrylamide, fumarate, maleate, norbornenyl and styrene functional groups, and/or polysiloxanes with multiple reactive groups such as hydrogen, hydroxy, alkoxy, amine, chlorine, epoxide, isocyanate, isothiocyanate, nitrile, vinyl, and thiol functional groups. Some specific examples of such polysiloxanes include vinyl-terminated-, hydroxyl-terminated, or methacrylate-terminated polydimethyl-co-diphenyl siloxanes and/or polydimethyl-co-methylhydro-siloxanes. In one aspect, the function group is located at one or both terminuses of the precursor component.

In one aspect, precursor components comprising or consisting essentially of silsesquioxane moieties and/or polysilsequioxane moieties can be employed for the coating.

Polyhedral oligomeric silsesquioxanes and/or polysilsesquioxanes may be either homoleptic systems containing only one type of R group, or heteroleptic systems containing more than one type of R group. POSS-moieties are inclusive of homo- and co-polymers derived from moieties comprising silsesquioxanes with functionality, including mon-functionality and multi-functionality. Poly-POSS moieties encompass partially or fully polymerized POSS moieties as well as grafted and/or appended POSS moieties, end-terminated POSS moieties, and combinations.

Examples of suitable POSS moieties encompassed by the present disclosure include, but are not limited to, the following open-cage and/or closed cage molecules, having from zero up to and including eight non-reactive or reactive sites, where each of the sites, independently, can be substituted/un-substituted alkyl-, branched/un-branched alkyl-, cyclic/acyclic alkyl-, hydroxyl-, alkoxyl-, amine-, halo/chloro-, epoxy-, isocyanate-, acrylate/methacrylate-, acrylamide/methacrylamide-, nitrile-, norbornenyl-, vinyl-, amide/methacrylamide-, nitrile-, norbornenyl-, vinyl-, hydrogen-, thiol-, silanol-, aryl, substituted aryl, and/or styrenyl-containing groups.

In another embodiment, the precursor components comprise at least one homo- and co-polymers (or oligomers) formed with POSS moieties as part of the polymer backbone and/or as an appendage from the polymer, inclusive of polysilsesquioxanes described above. Examples of polysilsesquioxanes include, for example, polystyryl-POSS, poly{meth}acrylate-POSS, polynorbornyl-POSS, polyvinyl-POSS, polyepoxy-POSS, and polysiloxane-POSS. Poly-POSS moieties are further inclusive of the aforementioned polymers and other functionalized polymers that are configured to incorporate the silsesquioxane functionality as an appendage from, or within a polymer backbone.

In one aspect, one or more POSS moieties having one or more Si—H (silicon hydride) groups can be used and/or added to precursor components, e.g. silicones having Si-vinyl functional groups) to provide a coating via a platinum metal catalyzed hydrosilation reaction between the POSS hydride functionality and precursor component Si-vinyl functional groups. The Si—H and Si-vinyl functional groups can be reversed, that is, Si-vinyl groups can be associated with the POSS moiety and Si—H functional groups can be associated with the precursor components. Likewise, combinations of POSS moieties comprising, independently, Si—H and Si-vinyl functional groups can be used as the precursor components.

Viscosity Stabilizers

In one aspect, one or more viscosity stabilizers are used in combination with the one or more precursor components, for example, to extend the useful life of the coating prior to its application to the LED lamp. In one aspect, the viscosity stabilizer provides for a slow increase in viscosity of a curable one- or two-part-composition prepared in the course of coating an LED lamp. In one particular aspect, the viscosity stabilizer is specific for a platinum metal and/or rhodium noble metal catalyzed hydrosilation reaction between a Si-hydride and Si-vinyl functional groups. In one aspect, viscosity stabilizer can include phosphines ($PR_3$, where R is a $C_1$ to $C_{20}$ or aromatics); such as triphenylphosphine; phosphites ($R_3PO_3$, where R is a $C_1$ to $C_{20}$ or aromatics); such as triethylphosphite, phosphine oxide ($R_3PO$), phosphinite ($R_2P(OR)$), phosphonite ($RP(OR)_2$), phosphinate ($R_2PO(OR)$), phosphonate ($RPO(OR)_2$), phosphate ($PO(OR)_3$), Oxoacids of phosphorus and their salts, such as phosphorous acid, tripolyphosphoric acid, pyrophosphoric acid, Arsines, stibenes, selenide, telluride, Triphenylarsine, triphenylstibene, P-chlorophenylcarboxymethylselenide; chlorinated hydrocarbons that contain amines; hydroperoxy radical containing compounds, such as tertiary butyl hydroperoxide, methylethylketone hydroperoxide, cumene hydroperoxide, 1,1,3,3,-tetramethylbutyl hydroperoxide and 2,5-dimethyl-2,5-dihydroperoxyhexane; 1-hydroxycyclohexyl hydroperoxide, 1,1,3,3-tetramethylbutyl hydroperoxide, 2,5-dimethyl-2,5-dihydroperoxy hexane, decalin hydroperoxide, 1,1,2,2-tetramethylpropyl hydroperoxide, p-methane hydroperoxide and pinane hydroperoxide; acetylenic compounds, for example acetylenic alcohols, maleates, dicarboxylates, and/or copper salts of naphthenic acid.

Other viscosity stabilizers can include, for example, alkynic or alkynl alcohols, such as 5-hexyn-1-ol, 2-hexyn-1-ol, 3-hexyn-1-ol, 1-Hexyn-3-ol, 3,5-Dimethyl-1-hexyn-3- ol, 5-Methyl-1-hexyn-3-ol, 3-hexyn-2-ol, 5-hexyn-3-ol, 4-hexyn-3-ol, 2-methyl-3-hexyn-2-ol, 1-phenyl-1-hexyn-3-ol, 2-(3-hexyn-1-yloxy)ethanol, 1-(2-oxiranyl)-4-hexyn-1-ol, 6-phenyl-5-hexyn-3-ol, (1s)-1-[(2s)-2-oxiranyl]-4-hexyn-1-ol, (2s)-2-methyl-6-(trimethylsilyl)-5-hexyn-1-ol, 2,2-di methyl-3-(6-methoxy-2-naphthyl)-4-hexyn-3-ol, 5-[2-(diethylamino)ethoxy]-2,5-dimethyl-3-hexyn-2-ol, 6-(1,3-dioxolan-2-yl)-3-hexyn-1-ol, 6-(tetrahydro-2H-pyran-2-yloxy)-3-hexyn-1-ol, 3-Butyn-1-ol, 3-butyn-2-ol, 2-butyn-1-ol, 2-methyl-3-butyn-2-ol, 2-phenyl-3-butyn-2-ol, 4-phenyl-3-butyn-2-ol, 4-chloro-2-butyn-1-ol, 4-diethylamino-2-butyn-1-ol, 4-(trimethylsilyl)-3-butyn-2-ol, 2-(4-fluorophenyl)-3-butyn-2-ol, 2-(3-fluorophenyl)-3-butyn-2-ol, 2-(2-fluorophenyl)-3-butyn-2-ol, 1,1,1-trifluoro-2-phenyl-3-butyn-2-ol, 1-[3-(trifluoromethyl)phenoxy]-3-butyn-2-ol, propargyl alcohol, 3-Butyn-2-ol, 4-Pentyn-1-ol, 3-(trimethylsilyl)propargyl alcohol; 1-pentyn-3-ol, 3-methyl-1-pentyn-3-ol, 3-ethyl-1-pentyn-3-ol, 4-methyl-1-pentyn-3-ol, 3,4-dimethyl-1-pentyn-3-ol, 1-phenyl-1-pentyn-3-ol, 1-phenyl-4-methyl-1-pentyn-3-ol, 3,4,4-trimethyl-1-pentyn-3-ol, 3-methyl-1-phenyl-1-pentyn-3-ol, 3-(4-cyclohexylphenyl)-4,4-dimethyl-1-pentyn-3-ol, 4-pentyl-1-ol, 3-pentyn-1-ol, 2-pentyn-1-ol, 4-pentyn-2-ol, 1-pentyn-3-ol, 3-pentyn-2-ol, 3-methyl-1-pentyn-3-ol, 4-methyl-1-pentyn-3-ol, 3-ethyl-1-pentyn-3-ol, 3,4-dimethyl-1-pentyn-3-ol, 1-phenyl-1-pentyn-3-ol, 5-(trimethylsilyl_4-pentyn-1-ol, 1-phenyl-4-methyl-1-pentyn-3-ol,1,1,1-trichloro-4-pentyn-2-ol, 1-phenyl-3-pentyn-2-ol, 3,4,4-trimethyl-1-pentyn-3-ol, 1-(2,4-dichlorophenyl)-4-4-dimethyl-2-pentyn-1-ol, 3-(3-chloro-4-propoxyphenyl)-4,4-dimethyl-1-pentyn-3-ol, 3-methyl-1-phenyl-1-pentyn-3-ol, 4,4-dimethyl-3-(2-naphthyl)-1-pentyn-3-ol, 4,4-dimethyl-3-(4-phenoxyphenyl)-1-pentyn-3-ol, 5-[(4-methoxybenzyl)oxy]-2-pentyn-1-ol, 5-[9-methylsulfanyl]methoxy)-1-(trimethysilyl)-1-pentyn-3-ol, 3-heptyn-1-ol, 2-heptyn-1-ol, 1-heptyn-3-ol, 4-heptyn-2-ol, 4-methyl-1-heptyn-3-ol, 3-methyl-1-heptyn-3-ol, 3,6-dimethyl-1-heptyn-3-ol, 7-phenyl-6-heptyn-3-ol, (3-methyl-7-(trimethylsilyl)-6-heptyn-2-ol, 4-propyl-1-(trimethylsilyl)1-1heptyn-4-ol, 5-(n-butyl-n-(2-hydroxyethyl)-amino)-2,6-dimethyl-3-heptyn-2-ol, 7-(tetrahydro-2h-pyran-2-yloxyl)-3-heptyn-1-ol, 4,4-dimethyl-1-(2-methyl-1,3-dioxolan-2-yl)-7-(trimethylsilyl)-6-heptyn-3-ol, 2-octyn-1-ol, 1-octyn-3-ol, 3-octyn-1-ol, 6-octyn-1-ol, 4-ethyl-1-octyn-3-ol, 1-chloro-1,1-difluoro-2-(trifluoromethyl)-3-cotyn-2-ol, 1-chloro-2-(4-fluorophenyl)-3-octyn-2-ol, 6-[2-(diethylamino)ethoxy]-3,6-dimethyl-4-octyn-3-ol.

Allyl or other unsaturated compounds can also be used as viscosity stabilizers, such as triallylisocyanurate, diallylisocyanurate, diallylethylisocyanurate, tributenylisocyanurate. diallylphenylisocyanurate; bis(2-alkoxyethyl) maleates, such as cis-$CH_3OCH_2CH_2O_2CCH=CHCO_2CH_2CH_2OCH_3$; bis(2-alkoxyethoxyethyl) maleates, such as cis-$CH_3OCH_2CH_2OCH_2CH_2O_2CCH=CHCO_2CH_2CH_2OCH_2CH_2OCH_3$; and bis(2-alkoxyisopropyl) maleates, such as cis-$CH_3OCH_2CH(CH_3)O_2CCH=CHCO_2CH(CH_3)CH_2OCH_3$ dimethyl maleate, diallyl maleate, dibutyl maleate, dioctyl maleate, fluvoxamine maleate, acepromazine maleate, ciproifan maleate, dibutylin maleate, asenapine maleate, pimethixene maleate, bis(2-ethylhexyl) maleate, mono-2-(methacryloyloxy)ethyl maleate, quipazine maleate salt, midazolam maleate salt, ethyl acetate, vinyl acetate, monomers or polymers containing acetate, such as polyvinylacetate, polyvinylacetate/acrylic copolymers, methylergonovine maleate, prochlorperazine maleate, carbinozamine maleate, pheniramine maleate; fumaric acid, fumarate and their derivatives, dimethyl fumarate, diethyl fumarate, derivatives of dicarboxylic acid, including adipic acid, aldaric acid, azelaic acid, acetonedicaroxylic acid, acetylenedicarboxylic acid, dipicolinic acid, glutaconic acid, glutamic acid, glutaric acid, oxalic acid, oxaloacetic acid, mesaconic acid, methylmalonic acid, n-methyl-d-aspartic acid, dimer acid, diglycolic acid, malonic acid, meconic acid, itaconic acid, isophthalic acid, succinic acid, sebacic acid, tartaric acid, tartronic acid; vinyl siloxanes, divinyl siloxanes, tetramethyl divinyl disiloxane, pentamethyl vinyl disiloxane, methyl siloxanes containing vinyls, phenyl siloxanes containing vinyl groups, methylphenylsiloxanes containing vinyls; compounds containing nitrides, amines or amides, such as compounds of the formula (PNCl2), phosphazenes, ethanolamine, n-methylethanolamine, triethanolamine, n,n-dimethyl ethanolamine, n-butylamine, diethylamine, triethylamine, tetramethylenediamine, cyclohexylamine, melamine, dimethylformamide, dibenzyldisulfide, thioacetic acid, allylthiourea, nitriles, cyanates, oximo, nitroso, hydrazo, azo compounds, adiponitrile, 2-butoxime, alpha-nitroso-beta-naphthol, chelates, edta (ethylenediaminetetraacetic acid), nta (nitriloacetic acid); compounds containing tin, fatty acid tin salts, such as those used in tin-catalyzed silicone release coatings; general compounds, pigments, fillers, additives; minerals that contain compounds listed previously; pigments that contain compounds listed previously; fillers such as silica, titanium oxide, aluminum oxide, alumina, titania, calcium carbonate containing compounds listed previously; sodium salts, such as sodium alginate or carboxymethylcellulose sodium salt, clays or binders that use polyvinylacetate or acrylics, anti-slip, antioxidant or other additives containing compounds listed previously, polyvinylacetate; polyvinylacetate/acrylic; and the like.

The above compositions can be catalyzed by a platinum and/or rhodium catalyst component, which can be all of the known platinum or rhodium catalysts which are effective for catalyzing the reaction between silicon-bonded hydrogen groups and silicon-bonded olefinic groups.

Diffusers/Phosphors, Etc.

In certain aspects, the curable coating and/or one or more precursor components can further comprise one or more of a diffusing material and/or phosphor. Thus, in any one or more of the aforementioned precursor component embodiments or resultant coating, a phosphor and/or diffuser can be added, incorporated therein, associated therewith, and/or combined. Phosphors include, for example, commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white-light emitting LED chips include, for example: $Tb_{3-x}RE_xO_{12}$:Ce(TAG), where RE is Y, Gd, La, Lu; or $Sr_{2-x-y}Ba_xCa_ySiO_4$:Eu.

Some phosphors appropriate for the LED lamp disclosed can comprise, for example, silicon-based oxynitrides and nitrides for example, nitridosilicates, nitridoaluminosilicates, oxonitridosilicates, oxonitridoaluminosilicates, and sialons. Some examples include: $Lu_2O_3$:$Eu^{3+}$ $(Sr_{2-x}La_x)(Ce_{1-x}Eu_x)O_4$ $Sr_2Ce_{1-x}Eu_xO_4$ $Sr_{2-x}Eu_xCeO_4SrTiO_3$:$Pr^{3+}$, $Ga^{3+}$ $CaAlSiN_3$:$Eu^{2+}$ $Sr_2Si_5N_8$:$Eu^{2+}$ as well as $Sr_xCa_{1-x}S$:EuY, where Y is halide; $CaSiAlN_3$:Eu; and/or $Sr_{2-y}Ca_ySiO_4$:Eu. Other phosphors can be used to create color emission by converting substantially all light to a particular color. For example, the following phosphors can be used to generate green light: $SrGa_2S_4$:Eu; $Sr_{2-y}Ba_ySiO_4$:Eu; or $SrSi_2O_2N_2$:Eu.

By way of example, each of the following phosphors exhibits excitation in the UV emission spectrum, provides a desirable peak emission, has efficient light conversion, and has acceptable Stokes shift, for example: Yellow/Green: $(Sr,Ca,Ba)(Al,Ga)_2S_4:Eu^{2+}Ba_2(Mg,Zn)Si_2O_7:Eu^{2+}$ $Gd_{0.46}Sr_{0.31}Al_{1.23}O_xF_{1.38}:Eu^{2+}_{0.06}$ $(Ba_{1-x-y}Sr_xCa_y)SiO_4:Eu$ $Ba_2SiO_4:Eu^{2+}$.

The lighting device can comprise solid-state light sources arranged with one or more phosphors so as to provide at least one of blue-shifted yellow (BSY), blue-shifted green (BSG), blue-shifted red (BSR), green-shifted red (GSR), and cyan-shifted red (CSR) light. Thus, for example, a blue LED with a yellow emitting phosphor radiationally coupled thereto and absorbing some of the blue light and emitting yellow light provides for a device having BSY light. Likewise, a blue LED with a green or red emitting phosphor radiationally coupled thereto and absorbing some of the blue light and emitting green or red light provides for devices having BSG or BSR light, respectively. A green LED with a red emitting phosphor radiationally coupled thereto and absorbing some of the green light and emitting red light provides for a device having GSR light. Likewise, a cyan LED with a red emitting phosphor radiationally coupled thereto and absorbing some of the cyan light and emitting red light provides for a device having CSR light.

Diffusers include light reflecting particles, for example, from material of high index of refraction. The high index of refraction material can be any material with an index of refraction of greater than about 2, greater than about 2.2, and greater than or equal to about 2.4., such as titanium dioxide, aluminum oxide, zinc oxide, zinc sulfide and combinations thereof. The average particle size of the diffuser particles can be between about 1 nanometer (nanoparticles) to about 500 microns. The diffuser can be added alone or in combination with the phosphor to the curable coating or to either part (Part A and/or Part B) or both parts of a two-part curable coating.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

In some embodiments, depending on the LEDs used, the frangible enclosure in these and other embodiments may be made of glass, or have the presently described coating on an interior surface of the glass, doped with a rare earth (or lanthanide) compound, for example, a lanthanide oxide or other dichroic material, for example alexandrite ($BeAl_2O_4$). In one aspect, the lanthanide oxide is neodymium oxide (or neodymium sesquioxide). Thus, with the enclosure being transmissive of light, due to the filtering (e.g., neodymium oxide) from the coating or layer thereon, light passing through the enclosure of the LED lamp is filtered so that the light exiting the enclosure exhibits a spectral notch. A spectral notch occurs is when a portion of the color spectrum of light passing through a medium is attenuated, thus forming a "notch" when the light intensity of the light is plotted against wavelength. Depending on the type or composition of glass or other material used to form or coat the enclosure, the amount of lanthanide oxide compound present, and the amount and type of other trace substances in the enclosure, the spectral notch can occur between the wavelengths of 520 nm and 605 nm. In some embodiments, the spectral notch can occur between the wavelengths of 565 nm and 600 nm. In other embodiments, the spectral notch can occur between the wavelengths of 570 nm and 595 nm. Such systems are disclosed in U.S. patent application Ser. No. 13/341,337, filed Dec. 30, 2011, titled "LED Lighting Using Spectral Notching" which is incorporated herein by reference in its entirety. Neodymium oxide and its equivalents can be incorporated in the coatings herein described, as well as an aromatic polymer such as an inherently UV stable polyester, the neodymium oxide being present in such coating at a loading sufficient to provide spectral notching. In other aspects, neodymium oxide can be powder-coated on the interior surface of the frangible enclosure, or coatings herein described deposited on the interior of the enclosure, and the coating can eliminate or reduce egress of the neodymium oxide should the enclosure be compromised.

LED Lamp Examples

LED lamps of any variety and/or shape can be used in the practice of the present disclosure. More particularly, LED lamps with frangible enclosures, such as glass enclosures, benefit from the present disclosure.

By way of example, LED lamps are disclosed as exemplary lighting devices suitable for the present disclosure. The lamp may also comprise a directional lamp such as BR-style lamp or a PAR-style lamp where the LEDs may be arranged to provide directional light, with or without reflecting surfaces. In other embodiments, the LED lamp can have any shape, including standard and non-standard shapes.

Thus, with reference to FIGS. 1A, 1B, 2A, 2B, and 3, lamp 1000 having a generally globe shaped enclosure 1114, comprises a solid-state lamp comprising a LED assembly 1130 with light emitting LEDs 1127. Multiple LEDs 1127 can be used together, forming an LED array 1128. The LEDs 1127 can be mounted on or fixed within the lamp in various ways. In at least some example embodiments, a submount (not shown) is used. In the present disclosure the term "submount" is used to refer to the support structure that supports the individual LEDs or LED packages and in one embodiment comprises a PCB although it may comprise other structures such as a lead frame extrusion or the like or combinations of such structures. The LEDs 1127 in the LED array 1128 include LEDs which may comprise an LED die disposed in an encapsulant such as silicone, and LEDs which may be encapsulated with a phosphor to provide local wavelength conversion when various options for creating white light are discussed. A wide variety of LEDs and combinations of LEDs may be used in the LED assembly 1130. FIG. 1B is a partial exploded view of main body 1114 of lamp 1000 having coating 69 on outer surface thereof. Coating 69 can be on inside surface and/or both inside/outside surfaces of main body 1114 as described herein. Coating 69 can be optically clear and/or transparent.

In some embodiments, the LED bulb 1000 is equivalent to a 60 Watt incandescent light bulb. In one embodiment of a 60 Watt equivalent LED bulb, the LED assembly 1130 comprises an LED array 1128 of 20 XLamp® XT-E High Voltage white LEDs manufactured by Cree, Inc., where each XLamp® XT-E LED has a 46 V forward voltage and includes 16 DA LED chips manufactured by Cree, Inc. and configured in series. The XLamp® XT-E LEDs may be configured having LEDs arranged in series, for a total of greater than 200 volts, e.g. about 230 volts, across the LED array 1128. In another embodiment of a 60 Watt equivalent LED bulb, 20 XLamp® XT-E LEDs are used where each XT-E has a 12 V forward voltage and includes DA LED chips arranged in series, for a total of about 240 volts across the LED array 1128 in this embodiment. In some embodiments, the LED bulb 1000 is equivalent to a 40 Watt incandescent light bulb. In such embodiments, the LED array 1130 may comprise 10 XLamp® XT-E LEDs where each XT-E includes 16 DA LED chips configured in series. The 10 46V XLamp® XT-E® LEDs may be configured in two parallel strings where each string has five LEDs arranged in series, for a total of about 230 volts across the LED array 1128. In other embodiments, different types of LEDs are possible, such as XLamp® XB-D LEDs manufactured by Cree, Inc. or others. Other arrangements of chip on board LEDs and LED packages may be used to provide LED based light equivalent to 40, 60 and/or greater other watt incandescent light bulbs, at about the same or different voltages across the LED array 1128. In other embodiments, the LED assembly 1130 can have different shapes, such as triangular, square and/or other polygonal shapes with or without curved surfaces.

Figure 3:
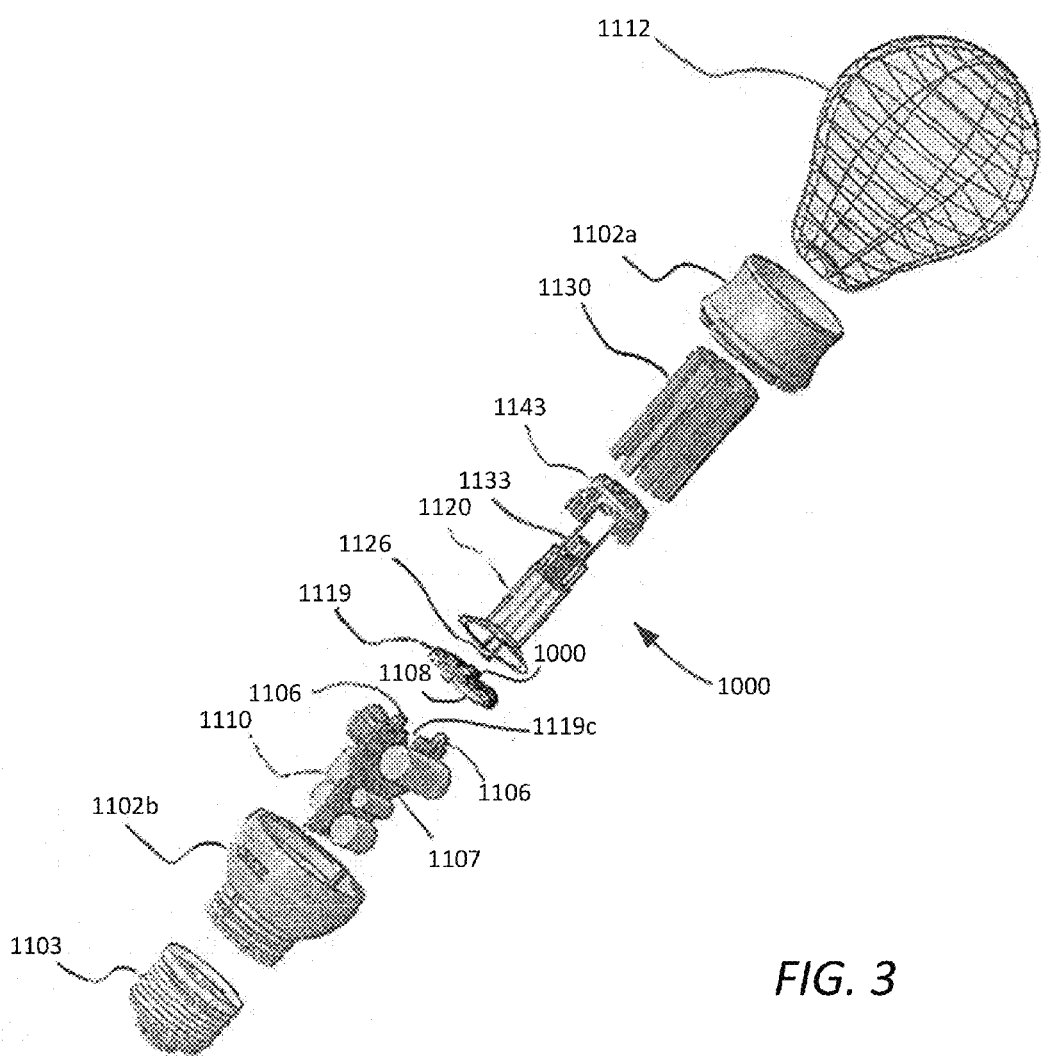
FIG. 3 is an exploded perspective view of the lamp of FIG. 2A.

Still referring to FIGS. 1-3, a modified base 1102 is shown comprising a two part base having an upper part 1102*a* that is connected to enclosure 1112 and a lower part 1102*b* that is joined to the upper part 1102*a*. An Edison screw 1103 is formed on the lower part 1102*b* for connecting to an Edison socket. The base 1102 may be connected to the enclosure 1112 by any suitable mechanism including adhesive, welding, mechanical connection or the like. The lower part 1102*b* is joined to the upper part 1102*a* by any suitable mechanism including adhesive, welding, mechanical connection or the like. The base 1102 may be made reflective to reflect light generated by the LED lamp. The base 1102 has a relatively narrow proximal end 1102*d* that is secured to the enclosure 1112 where the base gradually expands in diameter from the proximal end to a point P between the proximal end and the Edison screw 1103. By providing the base 1102 with a larger diameter at an intermediate portion thereof the internal volume of the base is expanded over that provided by a cylindrical base. As a result, a larger internal space 1105 is provided for receiving and retaining the power supply 1111 and drivers 1110 in the base. From point P the base gradually narrows toward the Edison screw 1103 such that the diameter of the Edison screw may be received in a standard Edison socket. The external surface of the base 1102 is formed by a smooth curved shape such that the base uniformly reflects light outwardly. Providing a relatively narrow proximal end 1102*d* prevents the base 1102 from blocking light from being projected generally downward and the concave portion 1107 reflects the light outwardly in a smooth pattern. The smooth transition from the narrower concave portion 1107 to the wider convex portion 1109 also provides a soft reflection without any sharp shadow lines.

FIGS. 4A, 4B, 5A, and 5B show, collectively, another exemplary LED lamp to illustrate an embodiment of a lamp 100 that, among other things, can serve as a replacement for an incandescent bulb. This embodiment makes use of similar components or features which have already been described, however, the heat sink element 154 and/or the housing portion 105 is unique to that of LED lamp 1000 discussed above. Lamp 100 may be used as an A-series lamp with an Edison base 102, more particularly; lamp 100 is designed to serve as a solid-state replacement for an A19 incandescent bulb. The Edison base 102 as shown and described herein may be implemented through the use of an Edison connector 103 and a plastic form. The LEDs 127 in the LED array 128 may comprise an LED die disposed in an encapsulant such as silicone, and LEDs which are encapsulated with a phosphor to provide local wavelength conversion when various options for creating white light are desired. The LEDs 127 of LED array 128 are mounted on a submount 129 and are operable to emit light when energized through an electrical connection. In some embodiments, a driver or power supply may be included with the LED array on the submount. In some cases the driver may be formed by components on a printed circuit board or "PCB" 80. While a lamp having the size and form factor of a standard-sized household incandescent bulb is shown, the lamp may have other the sizes and form factors. For example the lamp may be a PAR-style lamp such as a replacement for a PAR-38 incandescent bulb.

Enclosure 112 is, in some embodiments, made of a frangible material, such as glass, quartz, borosilicate, silicate, other glass or other suitable material. The enclosure may be of similar shape to that commonly used in household incandescent bulbs. In some embodiments, the glass enclosure is coated on the inside with silica 113 or other diffusive material such as refractory oxides, providing a diffuse scattering layer that produces a more uniform far field pattern. The enclosure may also be etched, frosted and coated with the protective layer as disclosed herein. Alternatively, the surface treatment may be omitted and a clear enclosure may be provided. It should also be noted that in this or any of the embodiments shown here, the optically transmissive enclosure or a portion of the optically transmissive enclosure could be coated or impregnated with phosphor or a diffuser. The glass enclosure 112 may have a traditional bulb shape having a globe shaped main body 114 that tapers to a narrower neck 115.

A lamp base 102 such as an Edison base functions as the electrical connector to connect the lamp 100 to an electrical socket or other connector. Depending on the embodiment, other base configurations are possible to make the electrical connection such as other standard bases or non-traditional bases. Base 102 may include the electronics 110 for powering lamp 100 and may include a power supply and/or driver and form all or a portion of the electrical path between the mains and the LEDs. Base 102 may also include only part of the power supply circuitry while some smaller components reside on the submount. With the embodiment of FIG. 6, as with many other embodiments of the present disclosure, the term "electrical path" can be used to refer to the entire electrical path to the LED array 128, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LED array. Electrical conductors run between the LED assembly 130, which seats against the heat conducting portion 152 to ensure good thermal conductivity between these elements, and the lamp base 102 to carry both sides of the supply to provide critical current to the LEDs 127.

The LED assembly 130 may be implemented using a printed circuit board ("PCB") and may be referred by in some cases as an LED PCB. In some embodiments the LED PCB comprises the submount 129. The lamp 100 comprises a solid-state lamp comprising a LED assembly 130 with light emitting LEDs 127. Multiple LEDs 127 can be used together, forming an LED array 128. The LEDs 127 can be mounted on or fixed within the lamp in various ways. In at least some example embodiments, a submount 129 is used. The LEDs 127 in the LED array 128 include LEDs which may comprise an LED die disposed in an encapsulant such as silicone, and LEDs which may be encapsulated with a phosphor to provide local wavelength conversion. A wide variety of LEDs and combinations of LEDs may be used in the LED assembly 130 as described herein. The LEDs 127 of the LED array 128 are operable to emit light when energized through an electrical connection. An electrical path runs between the submount 129 and the lamp base 102 to carry both sides of the supply to provide critical current to the LEDs 127.

Still referring to FIGS. 4A-5B, in some embodiments, a driver and/or power supply are included with the LED array 128 on the submount 129. In other embodiments the driver and/or power supply are included in the base 102 as shown. The power supply and drivers may also be mounted separately where components of the power supply are mounted in the base 102 and the driver is mounted with the submount 129 in the enclosure 112. Base 102 may include a power supply or driver and form all or a portion of the electrical path between the mains and the LEDs 127. The base 102 may also include only part of the power supply circuitry while some smaller components reside on the submount 129. In some embodiments any component that goes directly across the AC input line may be in the base 102 and other components that assist in converting the AC to useful DC may be in the glass enclosure 112. In one example embodiment, the inductors and capacitor that form part of the EMI filter are in the Edison base.

In some embodiments a gas movement device may be provided within the enclosure 112 to increase the heat transfer between the LEDs 127 and LED assembly 130 and heat sink 149. The movement of the gas over the LED assembly 130 moves the gas boundary layer on the components of the LED assembly 130. In some embodiments the gas movement device comprises a small fan. The fan may be connected to the power source that powers the LEDs 127. While the gas movement device may comprise an electric fan, the gas movement device may comprise a wide variety of apparatuses and techniques to move air inside the enclosure such as a rotary fan, a piezoelectric fan, corona or ion wind generator, synjet diaphragm pumps or the like.

The LED assembly 130 comprises a submount 129 arranged such that the LED array 128 is substantially in the center of the enclosure 112 such that the LED's 127 are positioned at the approximate center of enclosure 112. As used herein the term "center of the enclosure" refers to the vertical position of the LEDs in the enclosure as being aligned with the approximate largest diameter area of the globe shaped main body 114. In one embodiment, the LED array 128 is arranged in the approximate location that the filament is disposed in a standard incandescent bulb.

Figure 6A:
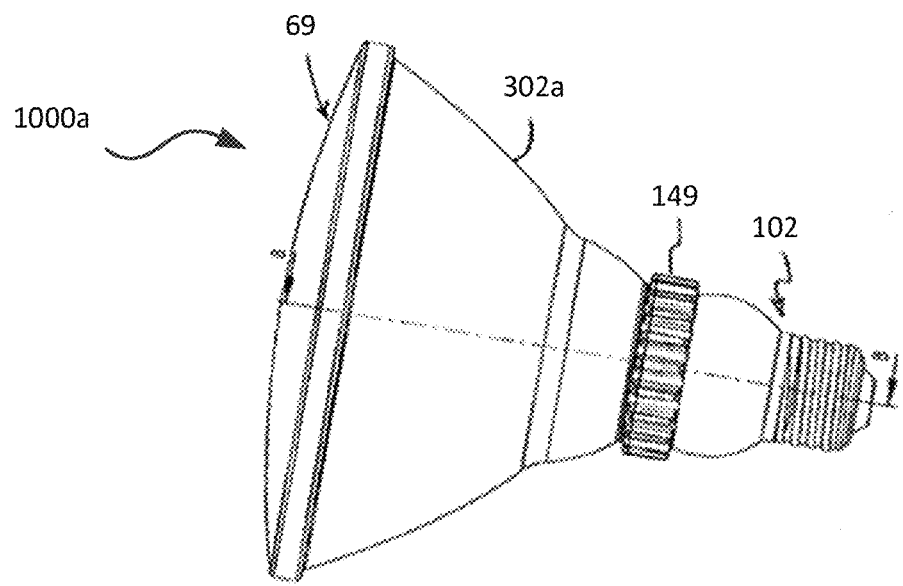
FIG. 6A is a perspective view of a BR-like LED lamp usable in embodiments of the present disclosure.
Figure 6B:
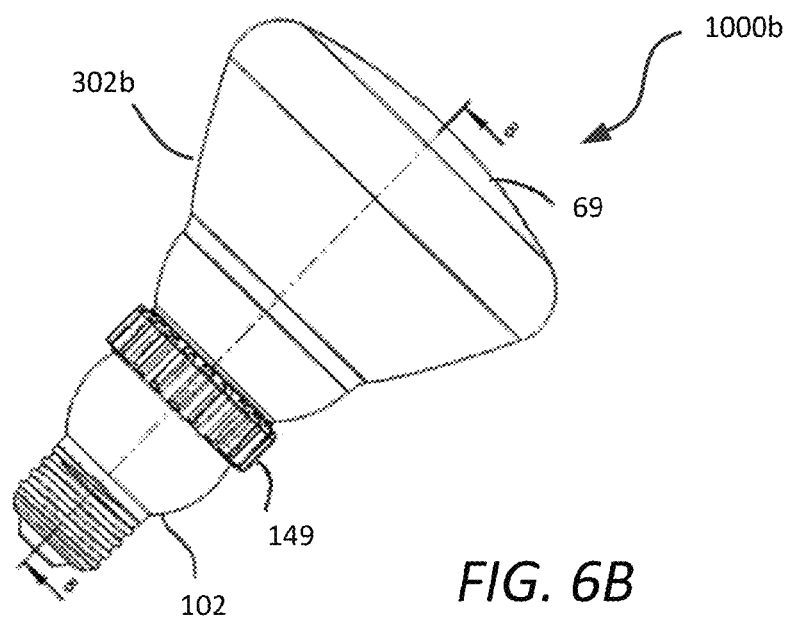
FIG. 6B is a perspective view of a PAR-like LED lamp usable in embodiments of the present disclosure.

FIG. 6A and FIG. 6B are embodiments of an exemplary LED lamp, more specifically, lamps different from an omnidirectional lamp such as an A19 replacement bulb discussed above. The BR or PAR bulbs shown in FIG. 6A and FIG. 6B, the light emitted in a directional pattern rather than in an omnidirectional pattern. Standard BR or PAR type bulbs are reflector bulbs that reflect light in a directional pattern; however, the beam angle is not tightly controlled and may be up to about 90-100 degrees or other fairly wide angles. With reference to FIG. 6A, a perspective view of a directional lamp 1000a, such as a replacement for a parabolic aluminized reflector ("PAR") incandescent bulb, is shown. Thus, the bulbs (1000a, 1000b) shown in FIGS. 6A-6B may be used as a solid state replacements for BR-type and PAR-typer reflector type bulbs or other similar bulbs. The bulbs of FIGS. 6A-6B include heat sink 149 and enclosures (302a, 302b). For example, lamp 1000a includes an LED array on submount (not shown), disposed within an outer reflector enclosed within enclosure 302a. A frangible glass or frangible plastic lens portion 702 can be coated with the coating 69 as disclosed herein. A power supply (not shown) can be housed in base portion 310 of lamp 1000a. Lamp 1000a may include an Edison base 102. A reflector (not shown) and lens portion 702 with coating 69 may together form the optically transmissive enclosure 302a for the lamp, albeit light transmission in this case is directional. Note that a lamp like lamp 1000a could be formed with a unitary enclosure, formed as an example from frangible material such as glass, appropriately shaped and silvered or coated on an appropriate portion to form a directional, optically transmissive enclosure. Lamp 1000a may include an environment, such as one or more inert gases, within the optically transmissive enclosure to provide thermal coupling to the LED array and any power supply components. With reference to FIG. 6B, lamp 1000b, can also be configured as a directional LED lamp, suitable for replacement of a BR-30 incandescent bulb. Coating 69 can be arranged on the entirety of either the interior or exterior surface of the enclosures 302a, 302b, and/or can be banded or layered about a portion of the enclosure.

Figure 7:
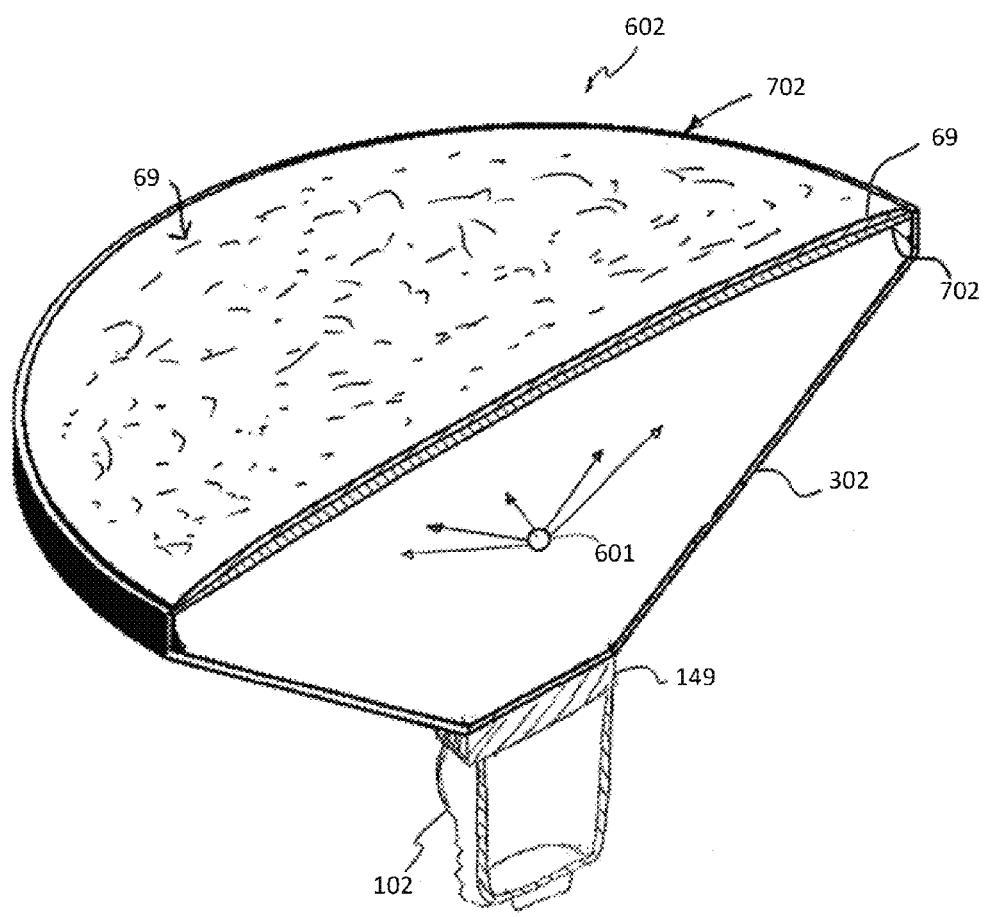
FIG. 7 is a sectional view of a LED lamp in accordance with embodiments of the present disclosure.

FIG. 7 depicts a cross-sectional view of a BR or PAR type bulb 602 showing an LED element 601 emitting essentially omnidirectional light to enclosure 302 (which may comprise reflecting elements) through frangible section 702 of enclosure 302 having coating 69 deposited thereon. Either coating 69 or interior of enclosure 302 can contain phosphors, or, phosphors can be positioned between the coating 69 and the frangible section 702 of enclosure 302. Enclosure 302 can be provided with or be configured to contain a first environment, for example, one or more inert gases as an environment, for improved cooling, a specific CRI, or other function.

Methods

To further explain the coating 69 and/or shatter resistance properties of the lamp 1000 an embodiment of a method of coating a lamp will be described. Any coating method useful for materials of similar viscosity to that of the precursor components (mixed or separately) can be used. For example, each part of a two-part composition can be separately handled, for example, in a spray apparatus, or they can be combined prior to or subsequent to being sprayed, atomized, flowed, brushed, or rolled on the surface of the LED lamp. In other example, the LED lamp can be dip coated into a bath of one or more of the precursor components. The precursor components can be mixed together or can be configured in separate baths for sequential dipping of the LED lamp. In another aspect, the LED lamp can be cascade-coated by passing through one or more flowing streams of one or more precursor components.

In another aspect, a combination of coating processes can be used, for example, a dip or cascade coating in combination with a spray coating. In one aspect, a second spray coating process can provide for one or more "bands" deposited on a first coating that was previously deposited on a LED lamp so as to provide a variable (or a defined) thickness of coating about the enclosure of the LED lamp, for example, the widest sections and/or the apex of the enclosure furthest from the Edison socket can be banded to improve impact and/or shatter resistance. The "bands" can independently contain one or more phosphors and/or diffuser materials. Banding can be on the exterior and/or interior of the LED lamp enclosure.

In certain aspects, the viscosity of the one or more precursor components is provided within a target range. In this aspect, the one or more precursor components can be solvent-free. Thus, in one aspect, the viscosity of the one or more precursor components is chosen to be between about 500 to about 20,000 centipoise, or about 750 to about 15,000 centipoise, or about 1000 to about 12,000 centipoise, or about 1500 to about 10,000 centipoise, or about 2000 to about 8,000 centipoise. In one aspect, the viscosity of the one or more precursor components is chosen to be between about 3,000 to about 7,000 centipoise, for example, to allow a continuous dip coating process of LED lamps.

Figure 8:
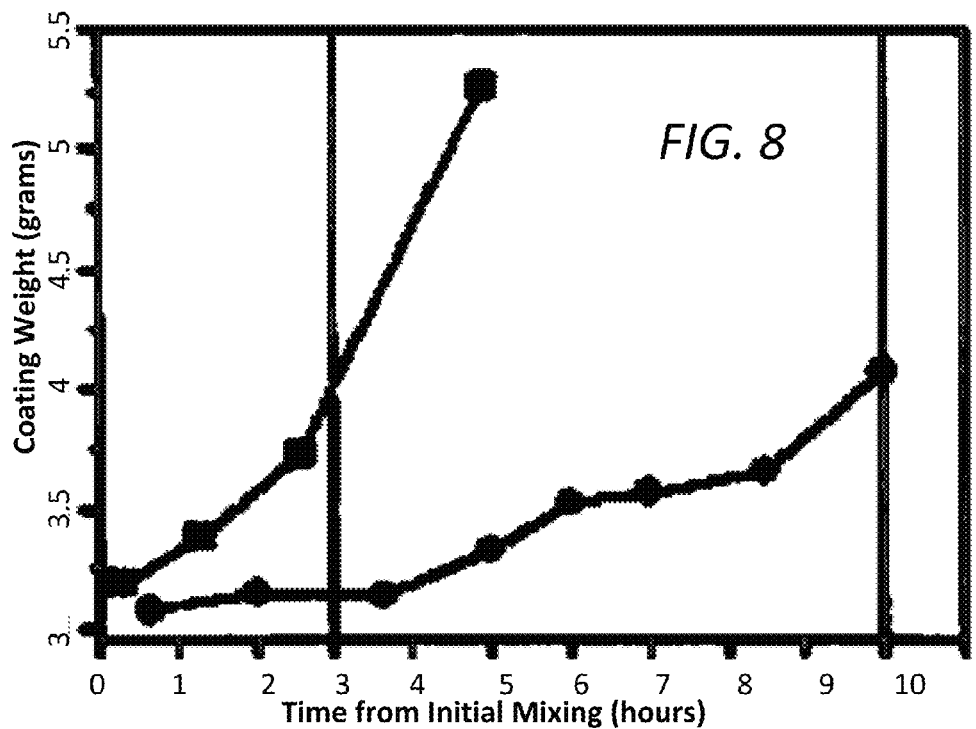
FIG. 8 is a graphic representation of the relationship of coating weight to time-from-initial-mixing of a coating composition in accordance with an embodiment of the present disclosure.
Figure 9:
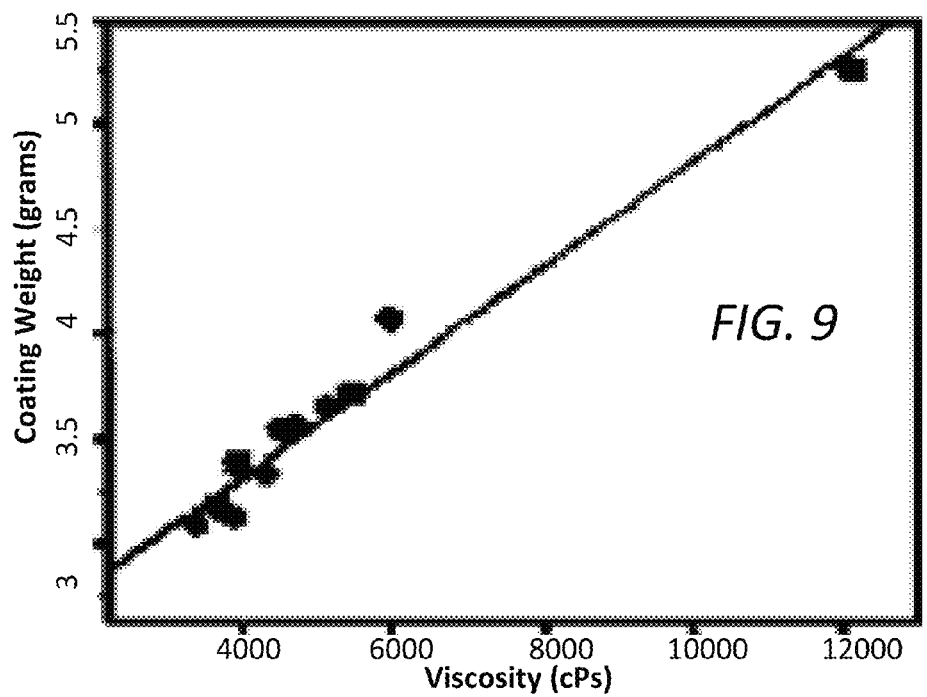
FIG. 9 is a graphic representation of the relationship of coating weight to coating composition viscosity of a coating composition in accordance with an embodiment of the present disclosure.

However, the viscosity of such solvent-free silicone elastomer mixtures increases from an initial viscosity, rapidly increasing at room temperature and becoming too viscous to be useable after a short time (3-24 hrs), making large-scale production processes difficult, in-efficient, and costly. For example, FIG. 8 and FIG. 9 depict the effect of time after mixing the curable coating precursor components on the resultant coating weight of a dip coated LED lamp. FIG. 8 shows the coating weight increase of two commercial silicone elastomers (circles: S1, squares: S2) as a function of the time-after-mixing. Likewise, FIG. 9 shows the increase in viscosity correlation with the coating thickness for the same precursor components of FIG. 8.

Thus, in an embodiment, one or more viscosity stabilizers can be used in combination with the one or more precursor components to maintain a target viscosity for a time interval at a temperature above that of a set/cure/gel temperature (a temperature capable of setting, curing, or gelling of the precursor components in the absence of the viscosity controlling agent). Maintaining a viscosity within a range is useful to control the coating thickness and/or coating weight about the LED lamp. The viscosity controlling agent can be used so that the temperature of the one or more precursor components can be maintained at an elevated temperature, e.g., any temperature below the set/cure temperature to alter the viscosity and thus provide for control of the thickness and/or weight of coating applied. Shown in FIG. 10, the difference between 0 weight percent viscosity stabilizer, 0.05 weight percent, and 0.1 weight percent stabilizer for a solvent-free, silicone elastomer material of the vinyl-silicone, silicon hydride family (designated "S1") as a function of viscosity (centipoise) verses time, is a significant improvement that extends the curable composition as much as 10×. Likewise, FIG. 11 shows similar results, albeit less of an improvement and requiring slightly more of the viscosity stabilizer, for another solvent free silicone material of the vinyl-silicone, silicon hydride family (designated "S2").

After the coating and/or precursor components are deposited on the LED lamp, the coating can be cured, or the cure process can be accelerated, by using heat and/or light to initiate and/or accelerate the crosslinking or coupling of the precursor components or to overcome the viscosity stabilizer.

EXAMPLES

Two working examples are provided as representative of the present disclosure and should not be considered limiting of the appended claims. Thus, S1 and S2, both are two-part silicone materials, were used as received as precursor components. Parts A and B were mixed without solvent to prepare a dipping bath at room temperature.

Example 1

As-mixed S1 increased to >5000 centipoise after about 8 hrs, which resulted in failure of the composition to provide acceptable coatings (by weight, thickness, or appearance) for LED lamps. The material gelled at less than <27 hrs.

Example 2

As-mixed S2 viscosity increased beyond useful range <3 hrs, which resulted in failure of the composition to provide acceptable coatings (by weight, thickness, or appearance) for LED lamps, and was found gelled at <8 hrs.

While the above is marginally acceptable for production, experiments were conducted with an exemplary viscosity stabilizer and was found to be an effective viscosity stabilizer, compatible with the tested silicone elastomer mixtures, and provided acceptable LED lamp coating quality and performance.

Example 3

Figure 10:
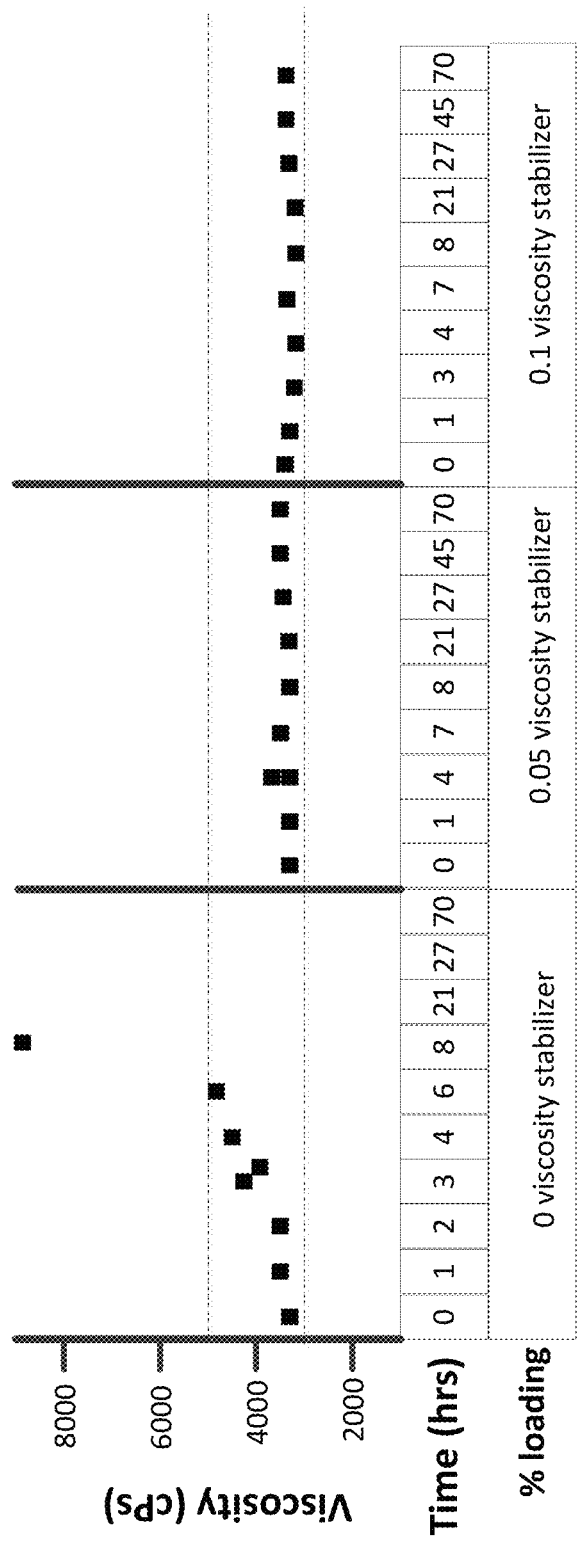
FIG. 10 is a graphic representation of the relationship of viscosity to both time-from-initial-mixing and viscosity stabilizer weight percent for a coating composition in accordance with an embodiment of the present disclosure.
Figure 11:
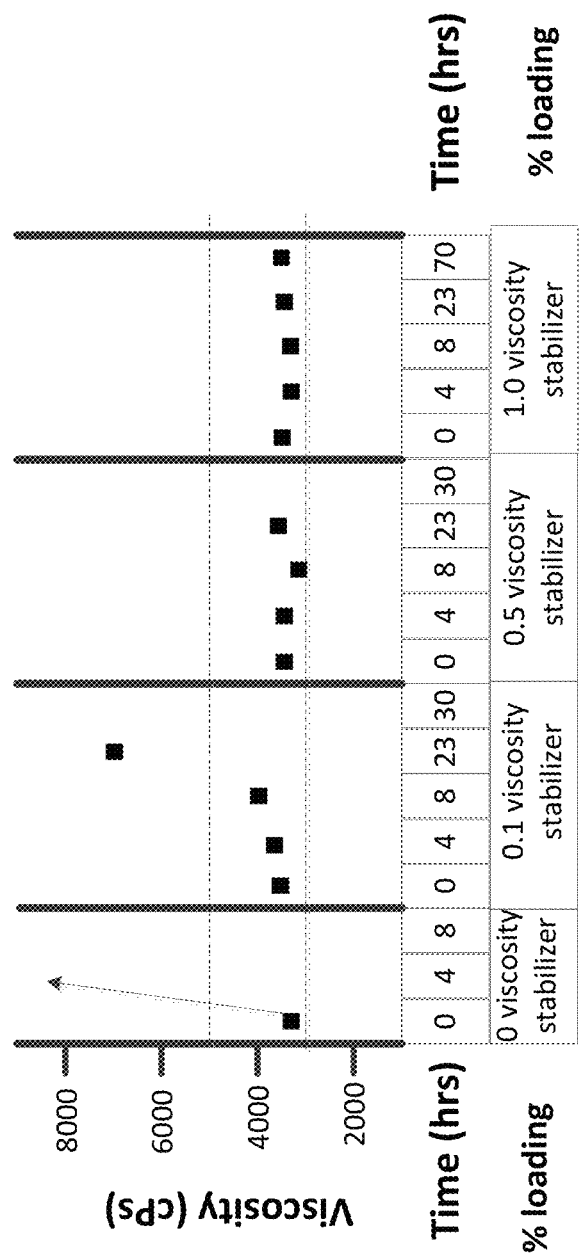
FIG. 11 is a graphic representation of the relationship of viscosity to both time-from-initial-mixing and viscosity stabilizer weight percent for a coating composition in accordance with an embodiment of the present disclosure.

S1 with 0.05% by weight viscosity stabilizer incorporated remained viscosity stable beyond 70 hrs as shown in FIG. 10. Post curing process was not affected.

Example 4

S2 with 0.5% of viscosity stabilizer showed good viscosity retention at room temperature beyond 23 hrs after mixing as shown in FIG. 11. Post curing process was not affected.

Thus, the present method demonstrates application of a clear silicone elastomer as coating 69 on a glass LED lamp. The resultant LED lamp passes the safety drop test (NMX-J-578/1-ANCE, CSA C22.2 NO. 1993-09, UL 1993, Section 8.8). In addition, the present method provides for a solvent-free coating process that is suitable for dip coating LED lamps, and the resultant coated LED lamp is clear, tack-free.

Figure 12:
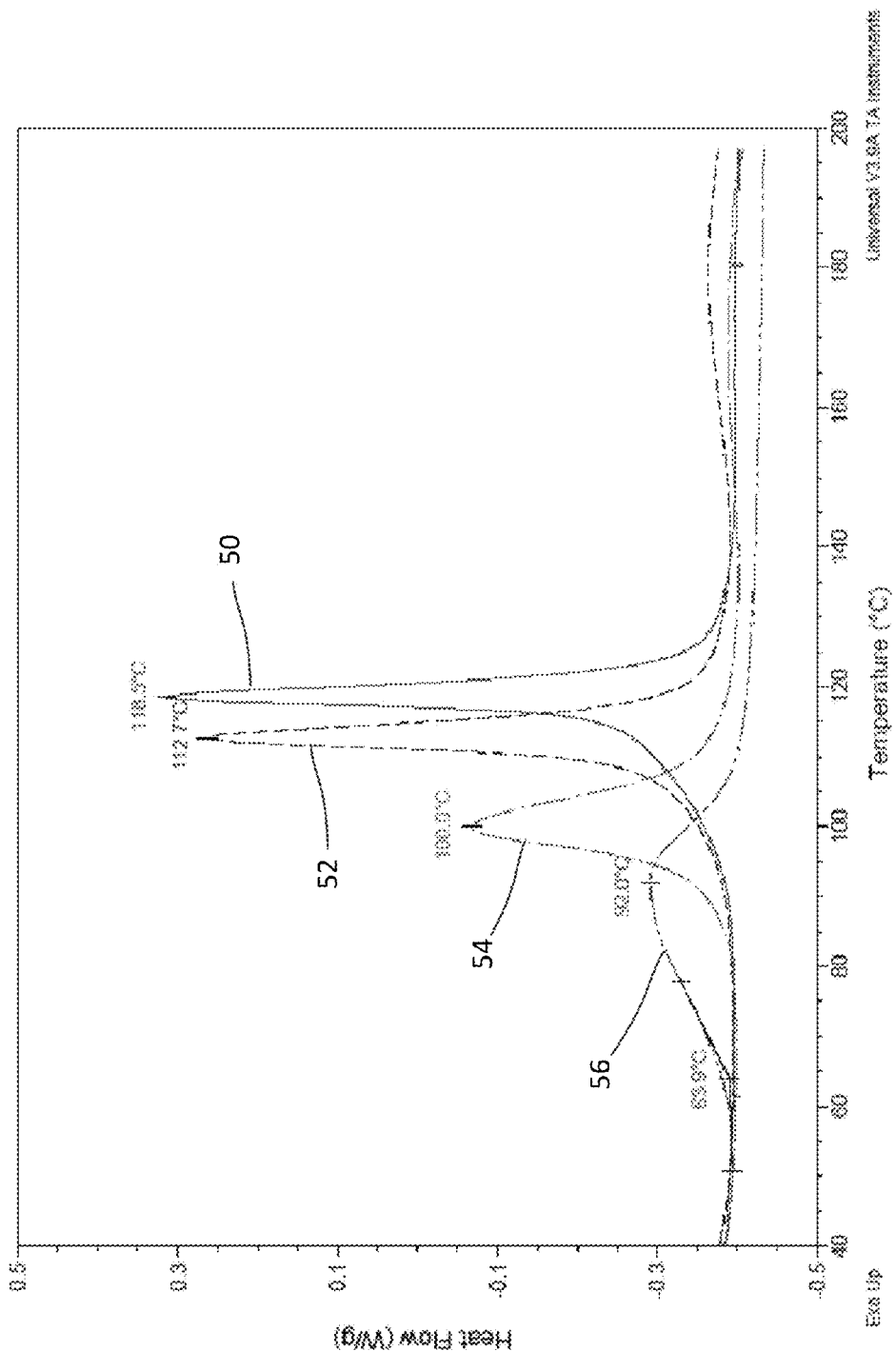
FIG. 12 is a differential scanning calorimetry (DSC) graph of exothermic heat flow from various embodiments disclosed herein.

Furthermore, the working life (pot life) of the solvent-free silicone elastomer precursor components can be extended from only a few hours to days by incorporating a viscosity stabilizer, making it possible for practicing the method in large, continuous operations (batch or continuous). As shown in FIG. 12, a Differential Scanning calorimetry (DSC) trace of silicone elastomer S2 with zero, 0.1, 0.5, and 1.0 weight percent loading of an alkynic-type viscosity stabilizer, is shown. Zero weight percent loading of viscosity stabilizer is shown by curve 56, having a peak exothermic temperature event, indicating curing, at about 92° C. Contrasted to curve 56, curves 50, 52, and 54, representing 1.0, 0.5, and 0.1 weight percent loading of acetylenic-type viscosity stabilizer, respectively, had peak exothermic temperature events of 118.5° C., 112.7° C., and 100° C., respectively, indicating an delay of the curing of S2 having viscosity stabilizer which would allow extended use of S2 at room temperature relative to that of S2 without a viscosity stabilizer.

Any aspect or features of any of the embodiments described herein can be used with any feature or aspect of any other embodiments described herein or integrated together or implemented separately in single or multiple components.

The presently disclosed precursor components and resulting coating prepared therefrom provide a number of solutions to the aforementioned problems. In one aspect, the resultant light transparent polymeric matrix, when present on a surface of an enclosure of an LED lamp, is capable of preventing or eliminating access to the internal components of the LED lamp should the enclosure be subjected to force that would otherwise shatter, chip, or break open the enclosure.

Second, the presently disclosed precursor components and resulting coating prepared therefrom can possibly provide an improved thermal path for the heat generated in the grains to be dissipated through the lens into ambient air, thereby resulting in higher conversion efficiency and less color shift over time.

Third, the presently disclosed precursor components and resulting coating prepared therefrom may provide an increase in refractive index of the coating, and/or the optical transparency.

It cannot be overemphasized that with respect to the features described above with various example embodiments of a LED lamp, the features can be combined in various ways. For example, the various methods of including phosphor in the lamp can be combined and any of those methods can be combined with the use of various types of LED arrangements such as bare die vs. encapsulated or packaged LED devices. The embodiments shown herein are examples only, shown and described to be illustrative of various design options for a lamp with an LED array.

The various parts of an LED lamp according to example embodiments of the present disclosure can be made of any of various materials. A lamp according to embodiments of the present disclosure can be assembled using varied fastening methods and mechanisms for interconnecting the various parts. For example, in some embodiments locking tabs and holes can be used. In some embodiments, combinations of fasteners such as tabs, latches or other suitable fastening arrangements and combinations of fasteners can be used which would not require adhesives or screws. In other embodiments, adhesives, solder, brazing, screws, bolts, or other fasteners may be used to fasten together the various components.

Although specific embodiments have been illustrated and described herein, those of ordinary skill in the art appreciate that any arrangement, which is calculated to achieve the same purpose, may be substituted for the specific embodiments shown and that the present disclosure has other applications in other environments. This application is intended to cover any adaptations or variations of the present disclosure. The following claims are in no way intended to limit the scope of the present disclosure to the specific embodiments described herein.

I claim:

1. An LED lamp comprising:
   at least one LED element energizable through an electrical connection and internal electrical components, wherein the internal electrical components comprise at least one of a power supply, driver, AC/DC converter, and associated electrical path or circuitry thereof;
   a frangible enclosure having an internal surface and an external surface, the frangible enclosure coupled to a threaded metal base; the frangible enclosure enclosing the at least one LED element and at least a portion of the internal electrical components, the frangible enclosure having a main body that tapers to a narrow neck in proximity to the metal base; wherein at least one LED element is positioned above the narrow neck and is capable of directly emitting light through the narrow neck; and
   a coating comprising one or more phosphors, diffusers, and lanthanide oxides, the coating covering one or both of the internal surface and the external surface of the frangible enclosure, the coating providing impact and shatter resistance to the frangible enclosure;
   wherein the main body of the frangible enclosure has an apex and a wide portion tapering to the narrow neck, and wherein the coating about the apex or the wide portion is of a different thickness than that about the narrow neck.

2. The LED lamp of claim 1, wherein the coating comprises a polysiloxane or polyurethane.

3. The LED lamp of claim 2, wherein the polysiloxane is a cured, elastomeric polysiloxane or the polyurethane is an elastomeric polyurethane.

4. The LED lamp of claim 1, wherein the coating is at least partially non-transparent to light between about 350 nm to about 850 nm.

5. The LED lamp of claim 1, wherein the coating is transparent to light between about 350 nm to about 850 nm.

6. The LED lamp of claim 1, wherein the coating completely covers one of the internal surface or the external surface of the frangible enclosure.

7. The LED lamp of claim 1, wherein the coating completely covers both the internal surface and the external surface of the frangible enclosure.

8. The LED lamp of claim 1, wherein the at least one LED element is coated with one or more particulates selected from phosphors, diffusers, and lanthanide oxides.

9. The LED lamp of claim 1, wherein the frangible enclosure encloses the at least one LED element and at least a portion of the associated electrical path or circuitry of the internal electrical components.

* * * * *